United States Patent
Jang et al.

(10) Patent No.: US 11,437,579 B2
(45) Date of Patent: Sep. 6, 2022

(54) STRETCHABLE ELECTRONIC DEVICE AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Min Sang Park, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 16/612,882

(22) PCT Filed: Mar. 22, 2018

(86) PCT No.: PCT/KR2018/003305
§ 371 (c)(1),
(2) Date: Nov. 12, 2019

(87) PCT Pub. No.: WO2018/212443
PCT Pub. Date: Nov. 22, 2018

(65) Prior Publication Data
US 2020/0203608 A1    Jun. 25, 2020

(30) Foreign Application Priority Data
May 19, 2017   (KR) .......................... 10-2017-0062564

(51) Int. Cl.
*H01L 51/00*     (2006.01)
*H01L 51/50*     (2006.01)
(Continued)

(52) U.S. Cl.
CPC ............ *H01L 51/003* (2013.01); *H01L 25/13* (2013.01); *H01L 27/1218* (2013.01);
(Continued)

(58) Field of Classification Search
CPC ............... H01L 51/003; H01L 27/1266; H01L 51/0097; H01L 2251/5338; H01L 27/1218
See application file for complete search history.

(56) References Cited

U.S. PATENT DOCUMENTS

2007/0123001 A1* 5/2007 Reis ..................... H01L 24/96
257/E21.238
2010/0270618 A1* 10/2010 Takei .................. H01L 27/1214
257/E29.273
(Continued)

FOREIGN PATENT DOCUMENTS

JP       2012-156523 A     8/2012
KR   10-2010-0123755 A    11/2010
(Continued)

OTHER PUBLICATIONS

Hong Hocheng, et al., "Design, Fabrication and Failure Analysis of Stretchable Electrical Routings", Sensors, 2014, pp. 11855-11877, vol. 14.
(Continued)

*Primary Examiner* — Aaron J Gray
(74) *Attorney, Agent, or Firm* — Sughrue Mion, PLLC

(57) ABSTRACT

Disclosed is a method of fabricating a stretchable electronic device, the method including a step of forming one or more semiconductor devices on a first carrier substrate; a step of forming semiconductor device array patterns by separating semiconductor device arrays each including the semiconductor devices; a step of releasing the semiconductor device array patterns from the first carrier substrate; a step of forming a stretchable substrate on a second carrier substrate;

(Continued)

and a step of transferring the released semiconductor device array patterns onto the stretchable substrate.

12 Claims, 28 Drawing Sheets

(51) Int. Cl.
    *H01L 25/13*     (2006.01)
    *H01L 29/66*     (2006.01)
    *H01L 29/786*     (2006.01)
    *H01L 27/12*     (2006.01)

(52) U.S. Cl.
    CPC ...... *H01L 27/1225* (2013.01); *H01L 27/1266* (2013.01); *H01L 29/66969* (2013.01); *H01L 29/7869* (2013.01); *H01L 51/0097* (2013.01); *H01L 51/502* (2013.01); *H01L 2251/5338* (2013.01)

(56) References Cited

U.S. PATENT DOCUMENTS

| | | | | |
|---|---|---|---|---|
| 2012/0165759 A1* | 6/2012 | Rogers | ................. | A61B 5/6867 606/228 |
| 2014/0339527 A1* | 11/2014 | Lee | ........................ | H01L 27/32 438/34 |
| 2016/0240802 A1* | 8/2016 | Lee | ..................... | H01L 27/3241 |
| 2016/0293634 A1* | 10/2016 | Kim | ..................... | H01L 27/1259 |
| 2017/0301860 A1* | 10/2017 | Yamazaki | ............... | H01L 51/56 |

FOREIGN PATENT DOCUMENTS

| | | | |
|---|---|---|---|
| KR | 10-2011-0111209 A | 10/2011 | |
| KR | 10-2014-0143637 A | 12/2014 | |
| KR | 10-2016-0066721 A | 6/2016 | |

OTHER PUBLICATIONS

Dae-Hyeong Kim, et al., "Stretchable, Curvilinear Electronics Based on Inorganic Materials", Advance Materials, 2010, pp. 2108-2124, vol. 22.
International Search Report for PCT/KR2018/003305 dated Jun. 28, 2018 [PCT/ISA/210].
Korean Notice of Allowance for PCT/KR2018/003305 dated Oct. 16, 2018.

* cited by examiner

STRETCHABLE ELECTRONIC DEVICE AND METHOD OF FABRICATING THE SAME

CROSS-REFERENCE TO RELATED APPLICATION

This application is a National Stage of International Application No. PCT/KR2018/003305 filed Mar. 22, 2018 which claims priority to Korean Patent Application No. 10-2017-0062564, filed on May 19, 2017 in the Korean Intellectual Property Office, the disclosure of which is incorporated herein by reference.

CROSS-REFERENCE TO RELATED APPLICATION

This application claims priority to Korean Patent Application No. 10-2017-0062564, filed on May 19, 2017 in the Korean Intellectual Property Office, the disclosure of which is incorporated herein by reference.

TECHNICAL FIELD

The present invention relates to a stretchable electronic device and a method of fabricating the same, and more particularly, to a stretchable electronic device having improved reliability and a method of fabricating the same.

BACKGROUND ART

Recently, interest in flexible electronic devices is increasing. Flexible electronics is technology for mounting an electronic device on a flexible substrate, such as plastic, to implement a bendable or foldable electronic circuit or device. In particular, flexible electronics is attracting attention as a next generation technology in the display field.

In addition to flexible electronic devices, there is growing demand for stretchable electronic devices. A flexible electronic device may be bent while the overall length thereof is maintained. In comparison, a stretchable electronic device may be bent, and also the length thereof may be increased during bending.

Stretchable electronics is expected to create new fields in which electronic devices are applied. Potential applications include electronic skin and skin sensors for movable robotic devices, wearable electronic devices, mobile communication devices, bio-integrated devices, rollable devices, deformable devices, automotive displays, biomedical devices, e-skin, and the like. In addition, stretchable devices may be usefully used in various fields including displays and sensor arrays.

As an example of typical stretchable electronics, there is a stretchable display device having flexibility, in which a display is formed on a stretchable substrate. As an advantage of the stretchable display device, the shape thereof may be twisted or stretched when necessary.

On the other hand, a stretchable display device has a problem in that a stretchable substrate included in the stretchable display device loses elasticity thereof above a certain temperature.

As another problem, when a stretchable display device is twisted or stretched, the display performance thereof may be degraded depending on the degree of tension.

In particular, in a process of fabricating a stretchable display device, when a thin film transistor is formed on a stretchable substrate, elastic force is lost at a predetermined temperature or more, thereby limiting a process temperature range. In addition, stress due to external tensile force is transmitted to the thin film transistor, thereby degrading the properties of the thin film transistor.

Limited process temperature range may cause deterioration of a thin film transistor. In addition, when a stretchable display device including the thin film transistor is twisted or stretched repeatedly, or when the area of the stretchable display device is enlarged, deterioration of the thin film transistor may be more severe, and as a result, the lifespan and reliability of the device may be reduced.

DISCLOSURE

Technical Problem

Therefore, the present invention has been made in view of the above problems, and it is one object of the present invention to provide a stretchable electronic device having improved electrical properties and reliability and an increased lifespan, and a method of fabricating the same. According to the present invention, when the stretchable electronic device is fabricated, a plurality of semiconductor array patterns is formed using a laser beam, and the semiconductor array patterns are transferred onto a stretchable substrate. The stretchable electronic device fabricated through this process may be resistant to damage by external stress such as bending or stretching.

It is another object of the present invention to provide a stretchable electronic device and a method of fabricating the same. According to the present invention, when the stretchable electronic device is fabricated, a plurality of semiconductor array patterns is transferred onto a stretchable substrate to form stretchable regions and non-stretchable regions on the stretchable substrate. When the device is bent, only stretchable regions are stretched, which may prevent the electrical properties (e.g., drain current-gate voltage characteristics) of the device from changing depending on bending time.

Technical Solution

In accordance with one aspect of the present invention, provided is a method of fabricating a stretchable electronic device, the method including a step of forming one or more semiconductor devices on a first carrier substrate; a step of forming semiconductor device array patterns by separating semiconductor device arrays each including the semiconductor devices; a step of releasing the semiconductor device array patterns from the first carrier substrate; a step of forming a stretchable substrate on a second carrier substrate; and a step of transferring the released semiconductor device array patterns onto the stretchable substrate.

In the stretchable electronic device, one or more semiconductor device array patterns may be disposed on the stretchable substrate.

The semiconductor device array patterns may have a width of 500 μm to 5,000 μm.

In the step of transferring, the semiconductor device array patterns may be transferred onto the stretchable substrate at an interval of 500 μm to 5,000 μm.

The semiconductor device array patterns may be formed to have at least one of a stripe shape, a polygonal shape, and a circular shape.

The semiconductor devices may include at least one of a thin film transistor, a capacitor, diode, a light-emitting device, an active matrix organic light-emitting diode (AMOLED), an organic light-emitting device, an active matrix quantum dot light-emitting diode, a quantum dot light-emitting diode, a display, a secondary cell, a piezoelectric element, a sensor, and a solar battery.

In the step of forming semiconductor device array patterns, the semiconductor device arrays may be separated using a laser beam.

The step of forming a stretchable substrate may further include a step of forming a supporting layer on the second carrier substrate.

The step of forming a stretchable substrate may further include a step of forming an adhesive layer on the stretchable substrate.

The step of forming one or more semiconductor devices may include a step of forming a flexible substrate on the first carrier substrate; a step of forming a first gate electrode on the flexible substrate; a step of forming a gate insulating film on the first gate electrode; a step of forming an oxide semiconductor layer on the gate insulating film so that the oxide semiconductor layer corresponds to the first gate electrode; a step of forming a source electrode and a drain electrode on both sides of the oxide semiconductor layer, respectively; and a step of forming a passivation layer on the source and drain electrodes.

The step of forming a flexible substrate may further include a step of forming a supporting layer on the first carrier substrate.

The step of forming a flexible substrate may further include a step of forming a buffer layer on the flexible substrate.

The step of forming a source electrode and a drain electrode may further include a step of forming an etch stopper layer on the oxide semiconductor layer.

The step of forming a passivation layer may further include a step of forming a second gate electrode on the passivation layer.

The first and second gate electrodes are electrically connected to each other to receive identical voltages.

The step of forming a passivation layer may further include a step of forming a polyimide layer on the passivation layer.

The flexible substrate may include at least one of polyester, polyvinyl, polycarbonate, polyethylene, polyacetate, polyimide, polyethersulphone (PES), polyacrylate (PAR), polyethylene naphthalate (PEN), and polyethylene terephthalate (PET).

The oxide semiconductor layer may include at least one of indium gallium zinc oxide (IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc oxide (AZTO).

The source electrode or the drain electrode may include at least one of molybdenum (Mo), aluminum (Al), chromium (Cr), gold (Au), titanium (Ti), nickel (Ni), neodymium (Nd), and copper (Cu).

The stretchable substrate may include at least one of polydimethylsiloxane (PDMS), polyester, polyurethane (PU), polyurethane acrylate (PUA), polyphenylmethylsiloxane, hexamethyldisiloxane, polyvinyl alcohol (PVA), epoxy resins, and EcoFlex.

In accordance with another aspect of the present invention, provided is a stretchable electronic device including a stretchable substrate; at least one semiconductor device array pattern disposed on the stretchable substrate; and non-stretchable regions and stretchable regions, wherein the non-stretchable regions are regions where the semiconductor device array patterns are formed.

In the stretchable electronic device, the semiconductor device array patterns may be formed by separating semiconductor device arrays each including one or more semiconductor devices formed on a flexible substrate, and the separated semiconductor device array patterns may be released and transferred onto the stretchable substrate.

The non-stretchable regions may have a width of 500 μm to 5,000 μm.

An interval between the non-stretchable regions may be 500 μm to 5,000 μm.

An area of the non-stretchable regions may be 10% to 90% of an area of the stretchable substrate.

The semiconductor device may be a quantum dot light-emitting diode including a negative electrode; a first charge generating junction layer formed on the negative electrode; a quantum dot light-emitting layer formed on the first charge generating junction layer; a hole transport layer formed on the quantum dot light-emitting layer; a second charge generating junction layer formed on the hole transport layer; and a positive electrode formed on the second charge generating junction layer, wherein the first and second charge generating junction layers have a layer-by-layer structure in which a p-type semiconductor layer and an n-type semiconductor layer are sequentially formed.

Advantageous Effects

According to the method of fabricating a stretchable electronic device according to an embodiment of the present invention, when the stretchable electronic device is fabricated, a plurality of semiconductor array patterns is formed using a laser beam, and the semiconductor array patterns are transferred onto a stretchable substrate. The stretchable electronic device fabricated through this process can be resistant to damage by external stress such as bending or stretching. Therefore, the present invention can provide a stretchable electronic device having improved electrical properties and reliability and an increased lifespan.

According to the method of fabricating a stretchable electronic device according to an embodiment of the present invention, when the stretchable electronic device is fabricated, a plurality of semiconductor array patterns is transferred onto a stretchable substrate to form stretchable regions and non-stretchable regions on the stretchable substrate. When the device is bent, only stretchable regions are stretched, which can prevent the electrical properties (e.g., drain current-gate voltage characteristics) of the device from changing depending on bending time.

BEST MODE

Figure 1A:
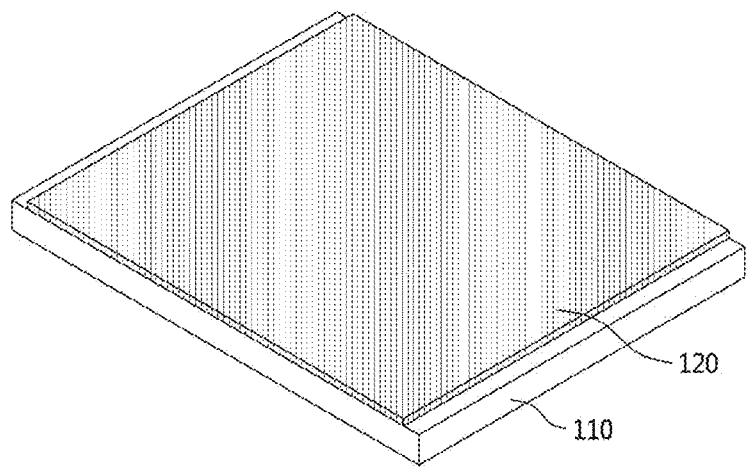
FIGS. 1A to 5 are three-dimensional views and top views for explaining a method of fabricating a stretchable electronic device according to an embodiment of the present invention.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a method of fabricating a stretchable electronic device according to an embodiment of the present invention will be described with reference to FIGS. 1A to 5.

FIGS. 1A to 5 are three-dimensional views and top views for explaining a method of fabricating a stretchable electronic device according to an embodiment of the present invention.

When a stretchable electronic device according to an embodiment of the present invention is fabricated, one or more semiconductor devices 130 are formed on a first carrier substrate 110, semiconductor device array patterns 140 are formed by separating semiconductor device arrays each including the semiconductor devices, and then the semiconductor device array patterns 140 are released from the first carrier substrate 110.

In addition, a stretchable substrate 150 is formed on a second carrier substrate.

Then, the semiconductor device array patterns 140 released from the first carrier substrate 110 are transferred onto the stretchable substrate 150.

Figure 1B:
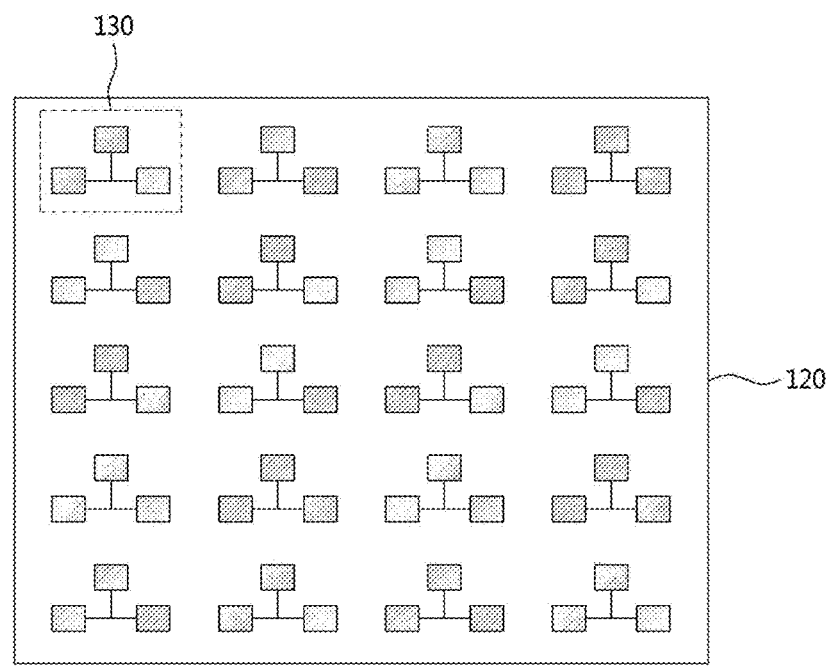

FIGS. 1A and 1B are a three-dimensional view and a top view showing one or more semiconductor devices formed on the first carrier substrate.

In the stretchable electronic device according to an embodiment of the present invention, one or more semiconductor devices 130 are formed on the first carrier substrate 110.

The semiconductor devices 130 may include one or more of a thin film transistor, a capacitor, a diode, a light-emitting device, an active matrix organic light-emitting diode (AMOLED), an organic light-emitting device, an active matrix quantum dot light-emitting diode, a quantum dot light-emitting diode, a display, a secondary cell, a piezoelectric element, a sensor, and a solar battery.

Preferably, the semiconductor devices 130 may be an oxide semiconductor thin film transistor, an organic light-emitting device, or a quantum dot light-emitting diode.

In addition, the semiconductor devices 130 may include a flexible substrate 120, and the flexible substrate 120 may include at least one of polyester, polyvinyl, polycarbonate, polyethylene, polyacetate, polyimide, polyethersulphone (PES), polyacrylate (PAR), polyethylene naphthalate (PEN), and polyethylene terephthalate (PET).

An oxide semiconductor thin film transistor, organic light-emitting device, and quantum dot light-emitting diode used as the semiconductor devices 130 will be described in detail with reference to FIGS. 9A to 9G and FIGS. 10A and 10B.

A silicon substrate, a glass substrate, or a metal substrate may be used as the first carrier substrate 110. In the case of a metal substrate, as the content of pure iron is increased, the cost of a metal substrate is lowered, and etching may be easily performed in a subsequent process. Accordingly, a metal substrate having a high content of pure iron is advantageous.

Figure 2:
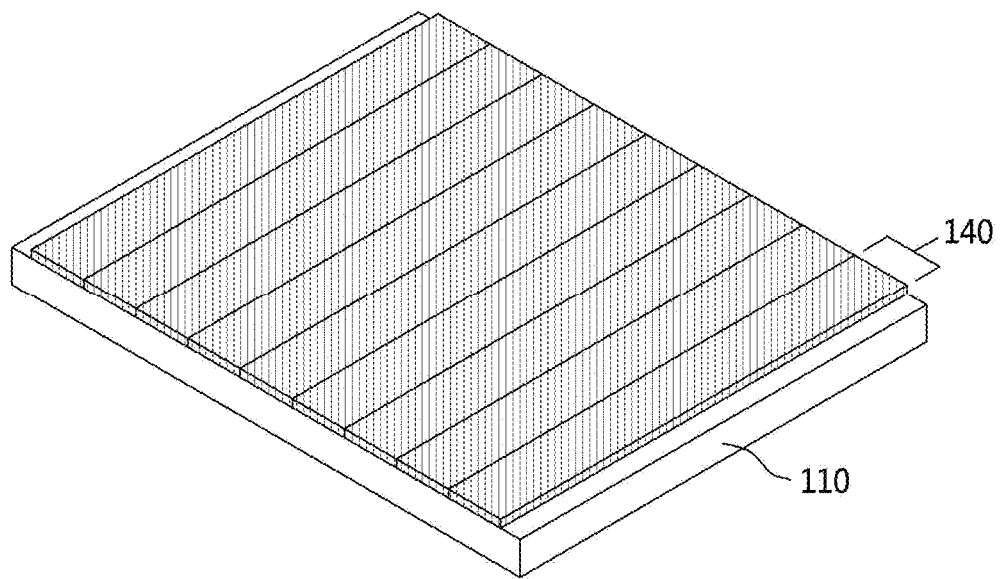

FIG. 2 is a three-dimensional view of semiconductor device array patterns formed by separating semiconductor device arrays each including one or more semiconductor devices.

In the stretchable electronic device according to an embodiment of the present invention, the semiconductor device array patterns 140 are formed by separating semiconductor device arrays each including the semiconductor devices 130.

The semiconductor device array means that one or more semiconductor devices 130 are arranged. When semiconductor device arrays each including one or more semiconductor devices 130 are separated, the semiconductor device array patterns 140 are formed.

The semiconductor device array patterns 140 may be separated using a laser beam.

When the flexible substrate 120 is irradiated with a laser beam, the irradiated flexible substrate 120 is thermally expanded. Subsequently, the thermally expanded flexible substrate 120 is cooled to shrink. By repeating the process of thermal expansion and shrinking, the semiconductor device array patterns 140 may be separated.

In addition, since a laser-emitting device outputs a laser beam of uniform intensity, the laser-emitting device may apply heat of uniform temperature. In addition, since the spot size of a laser beam may be adjusted as desired, the semiconductor device array patterns 140 may be separated by applying heat locally.

In addition, when the semiconductor device array patterns 140 are separated, an alignment key may be used. The alignment key represents a reference for forming the semiconductor device array patterns 140, and may be provided in a number corresponding to the semiconductor device array patterns 140.

The separated semiconductor device array patterns 140 may be formed to have at least one of a stripe shape, a polygonal shape, and a circular shape, preferably a stripe shape.

The semiconductor device array patterns 140 may have a width of 500 μm to 5,000 μm (5 mm). When the semiconductor device array patterns 140 have a width of 500 μm or less, when integrating semiconductor arrays and circuits according to purpose, restriction on formation regions may occur, making it difficult to integrate circuits such as gate drivers, or illuminant regions may be reduced, making it difficult to visualize a display. When the width of the semiconductor device array patterns 140 exceeds 5,000 μm, stretchable regions may be reduced.

In addition, one or more semiconductor device array patterns 140 may be disposed on the first carrier substrate 110, and the widths of the semiconductor device array patterns 140 may be the same or different.

Figure 6:
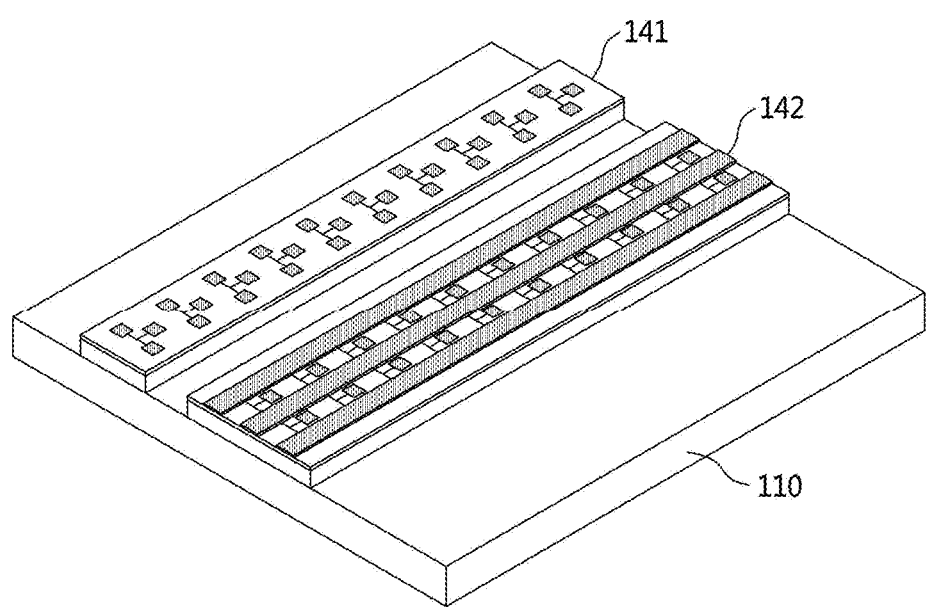
FIG. 6 is a three-dimensional view of semiconductor device array patterns having different widths.

FIG. 6 is a three-dimensional view of semiconductor device array patterns having different widths.

Referring to FIG. 6, the stretchable electronic device according to an embodiment of the present invention may include a first semiconductor device array pattern 141 and a second semiconductor device array pattern 142 having different widths.

In addition, the first semiconductor device array pattern 141 and the second semiconductor device array pattern 142 may different semiconductor devices.

That is, in the stretchable electronic device according to an embodiment of the present invention, the semiconductor device array patterns 141 and 142 having different widths or the semiconductor device array patterns 141 and 142 including different semiconductor devices are used. Accordingly, the stretchable electronic device may be easily fabricated, and the utilization of the stretchable electronic device may be increased.

For example, since the stretchable electronic device according to an embodiment of the present invention includes various semiconductor devices and circuits, such as an active matrix organic light-emitting diode (AMOLED) and a sensor array, depending on the purpose of use, the shape, size, or pattern of the stretchable electronic device may vary. Accordingly, the semiconductor device array patterns 141 and 142 having different widths may be included, thereby increasing the scope of application.

Figure 3:
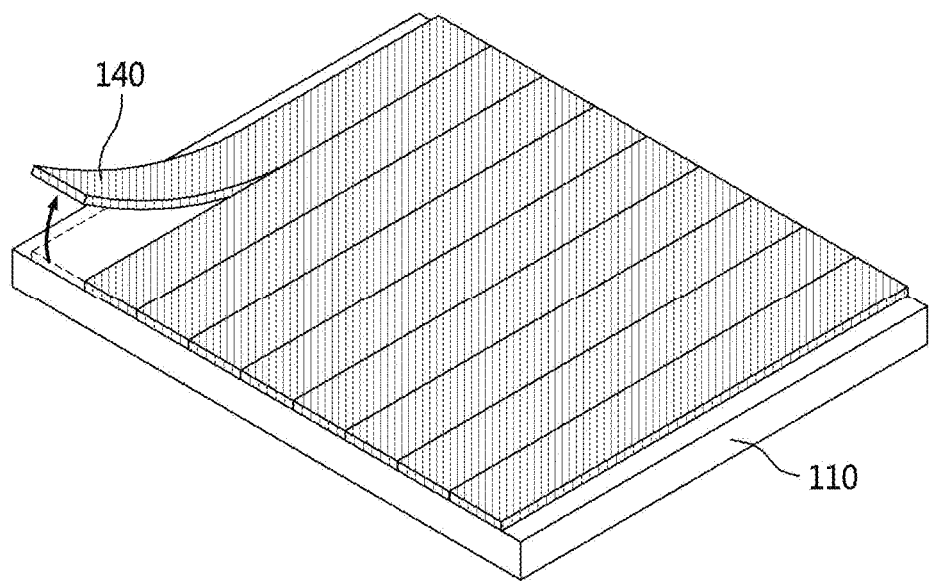

FIG. 3 is a three-dimensional view showing releasing of a semiconductor device array pattern from a first carrier substrate.

Referring to FIG. 3, the semiconductor device array patterns 140 formed on the first carrier substrate 110 are released.

The semiconductor device array patterns 140 may be released (or separated) from the first carrier substrate 110 through a mechanical process or a laser release process.

In the case of the mechanical process, the semiconductor device array patterns 140 may be separated from the first carrier substrate 110 by applying external force to the semiconductor device array patterns 140 and the first carrier substrate 110 in opposite directions.

In the case of the laser release process, the semiconductor device array patterns 140 may be separated from the first carrier substrate 110 by radiating a laser beam. In this case, the laser beam used has lower energy than the bandgap of the first carrier substrate 110 and higher energy than the bandgap of a flexible substrate. Thus, when radiating the laser beam, the laser beam passes through the first carrier substrate 110, and energy of the laser beam is applied to the interface of the flexible substrate.

Accordingly, the interface between the first carrier substrate 110 and the flexible substrate is instantaneously melted, so that the semiconductor device array patterns 140 are released from the first carrier substrate 110.

Figure 4:
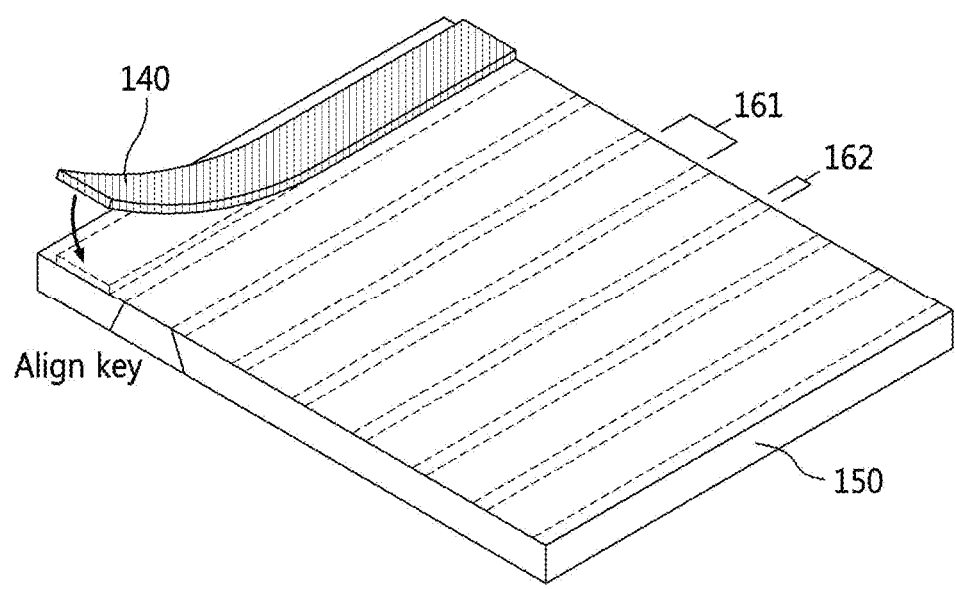

FIG. 4 is a three-dimensional view showing transfer of semiconductor device array patterns onto a stretchable substrate.

First, the stretchable substrate 150 is formed on a second carrier substrate (not shown), and then the semiconductor device array patterns 140 released from a first carrier substrate are transferred onto the stretchable substrate 150.

The stretchable substrate 150 will be described in more detail with reference to FIGS. 9H and 9I.

A silicon substrate, a glass substrate, or a metal substrate may be used as the second carrier substrate (not shown). In this case, the second carrier substrate may be formed of the same material as the first carrier substrate.

An adhesive layer (not shown) may be formed on the stretchable substrate 150, and the semiconductor device array patterns 140 may be transferred onto the adhesive layer (not shown).

Since the semiconductor device array patterns 140 are transferred onto the adhesive layer (not shown) formed on the stretchable substrate 150, a stretchable electronic device may be fabricated without causing defects in the semiconductor device array patterns 140.

In addition, when the semiconductor device array patterns 140 are transferred, an alignment key may be used. The alignment key represents a reference for forming the semiconductor device array patterns 140 on the stretchable substrate 150, and may be provided in a number corresponding to the semiconductor device array patterns 140 disposed on the stretchable substrate 150.

In addition, one or more semiconductor device array patterns 140 may be disposed on the stretchable substrate 150.

The semiconductor device array patterns 140 may be transferred onto the stretchable substrate 150 at an interval of 500 µm to 5,000 µm. When the interval is 500 µm or less, stretchable regions may be reduced. When the interval exceeds 5,000 µm, the number of semiconductor device array patterns to be disposed may be reduced.

Accordingly, in the method of fabricating a stretchable electronic device according to an embodiment of the present invention, the semiconductor device array patterns 140 are formed using a laser beam, and the semiconductor device array patterns 140 are transferred onto the stretchable substrate 140. Through this process, damage by external stress such as bending or stretching may be prevented, thereby improving the electrical properties and reliability of the device and increasing the lifespan of the device.

Figure 5:
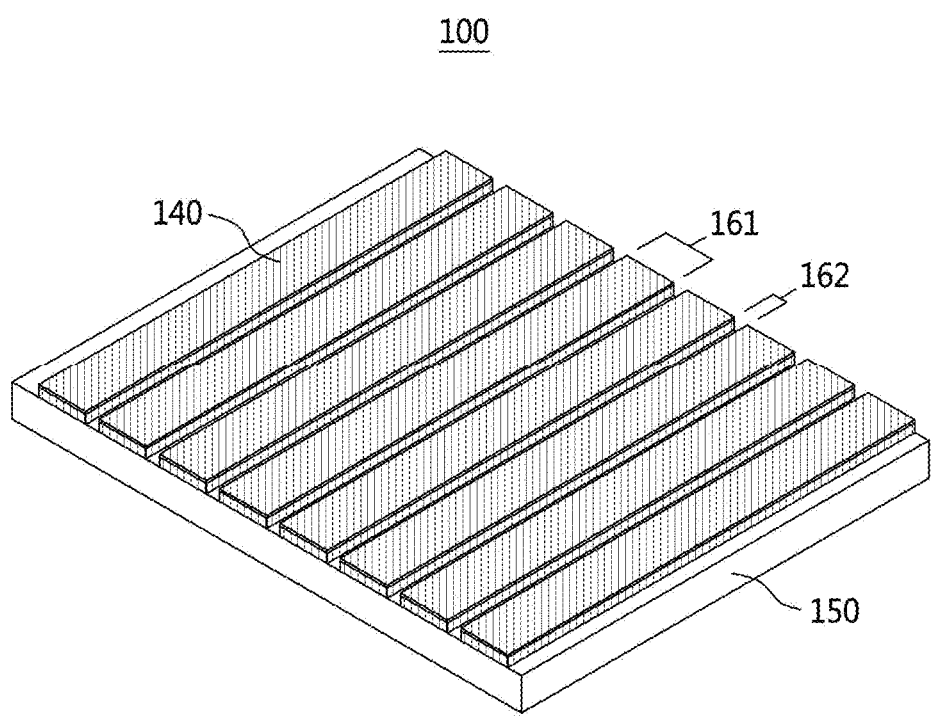

FIG. 5 is a three-dimensional view of a stretchable electronic device including one or more semiconductor device array patterns formed on a stretchable substrate.

Referring to FIG. 5, a stretchable electronic device 100 fabricated using the method of fabricating a stretchable electronic device according to the present invention includes one or more semiconductor device array patterns 140 disposed on the stretchable substrate 150.

In addition, the stretchable electronic device 100 of the present invention includes non-stretchable regions 161 and stretchable regions 162. The non-stretchable regions 161 are regions where the semiconductor device array patterns 140 are formed.

Figure 7:
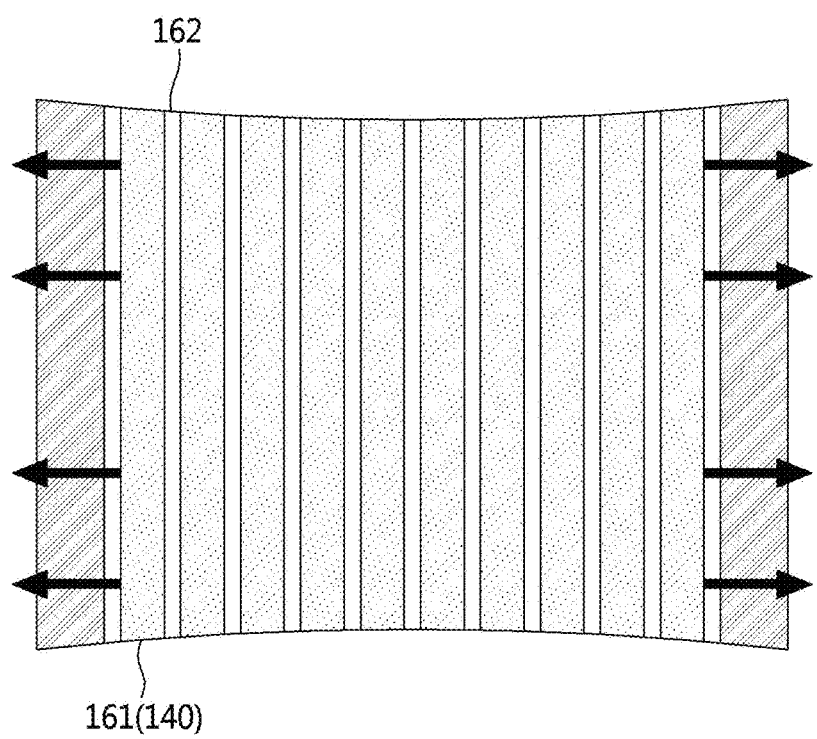
FIG. 7 is an image showing stretchable regions and non-stretchable regions formed in a stretchable electronic device according to an embodiment of the present invention in a stretched state.

FIG. 7 is an image showing stretchable regions and non-stretchable regions formed in a stretchable electronic device according to an embodiment of the present invention in a stretched state.

Referring to FIG. 7, the stretchable electronic device according to an embodiment of the present invention may include the semiconductor device array patterns 140 having a square shape or a stripe shape. When the stretchable electronic device is bent, only the non-stretchable regions 161 on which the semiconductor device array patterns 140 are not formed are stretched. Accordingly, it is possible to prevent electrical properties (e.g., drain current-gate voltage characteristics) from changing according to bending time.

Referring to FIG. 5 again, the non-stretchable regions 161 may have a width of 500 µm to 5,000 µm. When the width of the non-stretchable regions 161 is 500 µm or less, when integrating semiconductor arrays and circuits according to purpose, restriction on formation regions may occur, making it difficult to integrate circuits such as gate drivers, or illuminant regions may be reduced, making it difficult to visualize a display. When the width of the non-stretchable regions 161 exceeds 5,000 µm (5 mm), stretchable regions may be reduced.

In addition, the interval between the non-stretchable regions 161 may be 500 µm to 5,000 µm. When the interval between the non-stretchable regions 161 is 500 µm or less, stretchable regions may be reduced. When the interval between the non-stretchable regions 161 exceeds 5,000 µm, the number of semiconductor device array patterns to be disposed may be reduced.

In addition, the area of the non-stretchable regions 161 may be 10% to 90% of the area of the stretchable substrate 150. When the area of the non-stretchable regions 161 is 10% or less of the area of the stretchable substrate 150, the non-stretchable regions 161 may be reduced, and when integrating semiconductor arrays and circuits according to purpose, restriction on formation regions may occur, making it difficult to integrate circuits such as gate drivers, or illuminant regions may be reduced, making it difficult to visualize a display. When the area of the non-stretchable regions 161 is more than 10% of the area of the stretchable substrate 150, the stretchable regions 162 may be reduced.

Figure 8A:
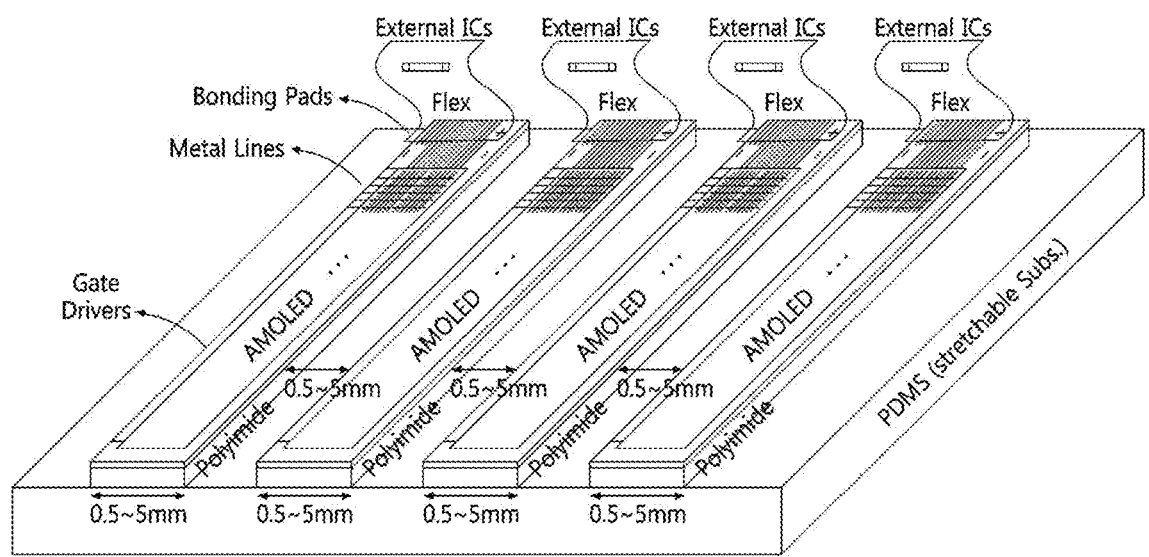
FIGS. 8A and 8B are three-dimensional views of the circuits of stretchable electronic devices according to embodiments of the present invention.
Figure 8B:
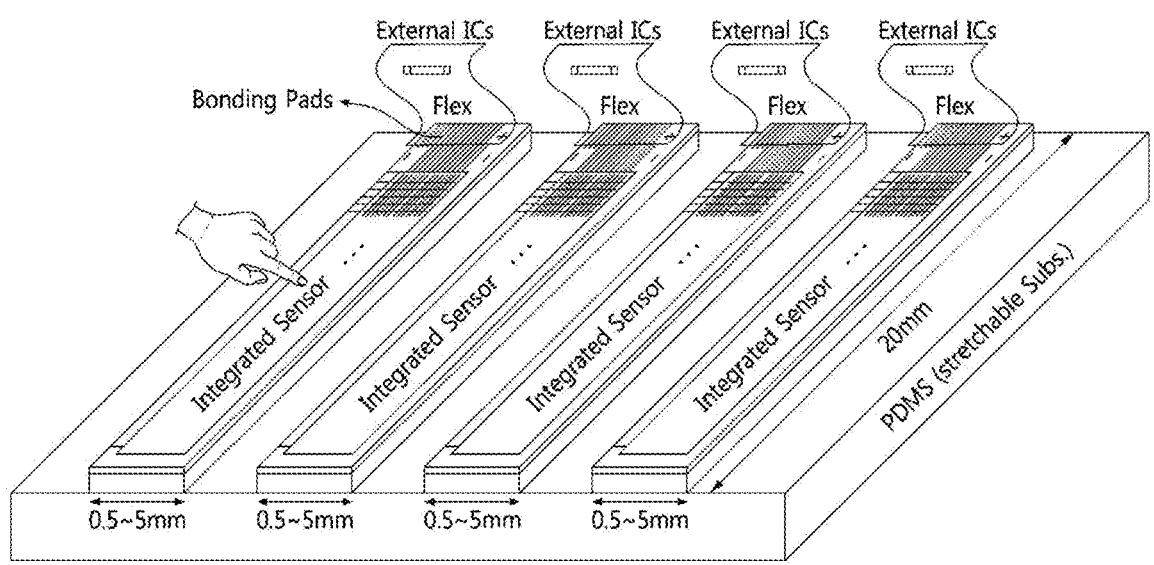

FIGS. 8A and 8B are three-dimensional views of the circuits of stretchable electronic devices according to embodiments of the present invention.

FIGS. 8A and 8B differ only in the semiconductor devices used in the stretchable electronic device according to an embodiment of the present invention, and are the same in terms of circuits. Thus, the circuits will be described with reference to FIG. 8A.

FIG. 8A is a three-dimensional view of the circuit of the stretchable electronic device according to an embodiment of the present invention including an active matrix organic light-emitting diode (AMOLED) as the semiconductor device.

An organic light-emitting device and a quantum dot light-emitting diode will be described in detail with reference to FIGS. 10A and 10B.

Referring to FIG. 8A, the stretchable electronic device according to an embodiment of the present invention includes one or more semiconductor device array patterns, and the semiconductor device array patterns include one or more semiconductor devices.

Referring to FIG. 8A, each semiconductor device pattern may include metal lines and bonding pads formed on a flexible substrate, and the bonding pads may be connected to flexible external integrated circuits (ICs).

More specifically, the flexible external integrated circuits may be mounted in a tape carrier package (TCP) or a chip-on-film (COF) package and attached using tape automatic bonding (TAB) to a peripheral region, i.e., a bonding pad, of the flexible substrate, which does not overlap active regions (e.g., the pixel areas of a display, the detection regions of a sensor).

The bonding pad may include a gate pad unit and a data pad unit in an edge region of the flexible substrate. The gate pad unit may supply a scan signal supplied from a gate driver IC to the gate lines of an active region (display unit), and the data pad unit may supply image information supplied from a data driver IC to the data lines of an active region.

In addition, in the active region, a plurality of gate lines may be arranged in a horizontal direction (or vertical direction) and connected to the gate pad unit, and a plurality of data lines may be arranged in a vertical direction (or horizontal direction) and connected to the data pad unit. Pixels including a thin film transistor and a pixel electrode may be formed in an intersection region where the gate lines and the data lines cross each other.

In addition, bonding wires may be provided between the bonding pads and the external integrated circuits to electrically connect the bonding pads and the external integrated circuits. The bonding wires may be an anisotropic conductive film (ACF) or a bump, and a plurality of bonding wires may be provided between the bonding pads and the external integrated circuits, respectively.

FIG. 8B is a three-dimensional view of the circuits of a stretchable electronic device according to an embodiment of the present invention including an integrated sensor as a semiconductor device.

In FIG. 8B, the integrated sensor used as the semiconductor device may be fabricated by technology that integrates a variety of sensors, and may include at least one of a touch sensor, a fingerprint sensor, an image sensor, a pressure sensor, a proximity sensor, a temperature sensor, and a light sensor.

In addition, the integrated sensor may include a sensor integrated with a display, such as an active matrix organic light-emitting diode or an active organic quantum dot light-emitting diode. The sensors capable of being integrated may include at least one of a touch sensor, a fingerprint sensor, an image sensor, a pressure sensor, a proximity sensor, a temperature sensor, and a light sensor.

Preferably, the integrated sensor includes a touch sensor integrated with an active matrix organic light-emitting diode or an active organic quantum dot light-emitting diode. In the configuration of the touch sensor, the surface of the touch sensor may be in contact with (e.g., touch) or adjacent to the surface of the device or a portion of the device.

In addition, sensing techniques using resistivity, optics, surface elasticity, capacitance, or any combination thereof may be applied to the touch sensor without being limited thereto.

FIGS. 9A to 9G are cross-sectional views for explaining a method of fabricating an oxide semiconductor thin film transistor used as the semiconductor device according to an embodiment of the present invention.

The semiconductor device may include at least one of a thin film transistor, a capacitor, a diode, a light-emitting device, an active matrix organic light-emitting diode (AMOLED), an organic light-emitting device, an active matrix quantum dot light-emitting diode, a quantum dot light-emitting diode, a display, a secondary cell, a piezoelectric element, a sensor, and a solar battery. Preferably, the semiconductor device may be an oxide semiconductor thin film transistor, an organic light-emitting device, or a quantum dot light-emitting diode.

In FIGS. 9A to 9G, an oxide semiconductor thin film transistor is described as an example of the semiconductor device. However, the present invention is not limited thereto, and various devices may be used as the semiconductor device.

In the method of fabricating a semiconductor device according to an embodiment of the present invention, a flexible substrate 330 is formed on a first carrier substrate 310, a first gate electrode 350 is formed on the flexible substrate 330, and a gate insulating film 360 is formed on the first gate electrode 350.

In addition, an oxide semiconductor layer 370 is formed on the gate insulating film 360 so that the oxide semiconductor layer 370 corresponds to the first gate electrode 350, a source electrode 381 and a drain electrode 382 are respectively formed on both sides of the oxide semiconductor layer 370, and a passivation layer 390 is formed on the source and drain electrodes 381 and 382.

Figure 9A:
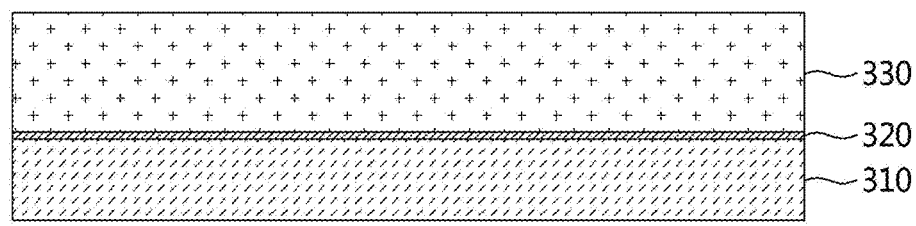
FIGS. 9A to 9G are cross-sectional views for explaining a method of fabricating a semiconductor device according to an embodiment of the present invention.

FIG. 9A is a cross-sectional view of a supporting layer and a flexible substrate formed on a first carrier substrate.

Referring to FIG. 9A, in the method of fabricating a semiconductor device according to an embodiment of the present invention, the flexible substrate 330 is formed on the first carrier substrate 310.

A silicon substrate, a glass substrate, or a metal substrate may be used as the first carrier substrate 310. In the case of a metal substrate, as the content of pure iron is increased, the cost of a metal substrate is lowered, and etching may be easily performed in a subsequent process. Accordingly, a metal substrate having a high content of pure iron is advantageous.

The flexible substrate 330 is a substrate for supporting an oxide semiconductor thin film transistor, and a substrate having flexibility may be used as the flexible substrate 330. The flexible substrate 330 may be bent or folded in a specific direction. For example, the flexible substrate 330 may be folded in a horizontal direction, a vertical direction, or a diagonal direction.

The flexible substrate 330 may include at least one of a polyimide polymer, a polyester polymer, a silicon polymer, an acrylic polymer, a polyolefin polymer, and a copolymer thereof.

Preferably, the flexible substrate 330 includes at least one of polyester, polyvinyl, polycarbonate, polyethylene, polyacetate, polyimide, polyethersulphone (PES), polyacrylate (PAR), polyethylene naphthalate (PEN), and polyethylene terephthalate (PET).

The flexible substrate 330 may be formed by performing coating using any one solution process selected from spin-coating, slot-die coating, inkjet printing, spray coating, and dip coating, preferably spin-coating. In spin coating, a predetermined amount of a solution is dropped onto a substrate while the substrate is rotated at a high speed. At this time, the substrate is coated with the solution by centrifugal force generated during rotation.

For example, the first carrier substrate 310 may be coated with a polyimide solution to form the flexible substrate 330. The flexible substrate 330 may be in the form of a film.

In addition, when the stretchable electronic device according to an embodiment of the present invention is implemented as a transparent flexible display device, the flexible substrate 330 may be formed of a transparent flexible material.

The flexible substrate 330 may have a thickness of 1 μm to 30 μm, preferably 1 μm to 10 μm.

When the thickness of the flexible substrate 330 is less than 1 μm, the flexible substrate 330 is so thin that the flexible substrate 330 is incapable of supporting the device. When the thickness of the flexible substrate 330 exceeds 30 μm, flexibility may be reduced.

In addition, according to an embodiment of the present invention, a supporting layer 320 may be formed on the first carrier substrate 310.

The supporting layer 320 serves to support an oxide semiconductor thin film transistor, and carbon nanotube-graphene oxide (CNT-GO) may be used to form the supporting layer 320 having transparency.

Carbon nanotube-graphene oxide used as the supporting layer 320 has a bending property, and thus is suitable for application to a stretchable electronic device.

Figure 9B:
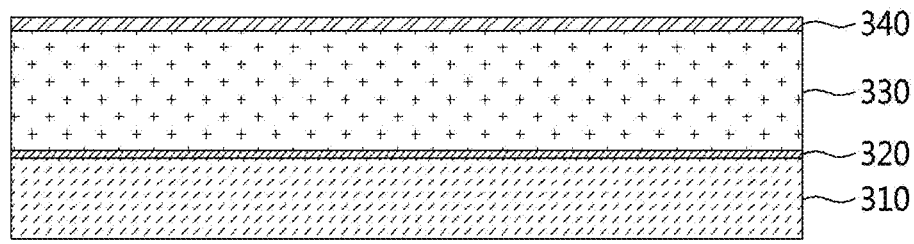

FIG. 9B is a cross-sectional view of a buffer layer formed on a flexible substrate.

Referring to FIG. 9B, in the method of fabricating an electronic device according to an embodiment of the present invention, a buffer layer 340 may be formed on the flexible substrate 330.

The buffer layer 340 may prevent external impurities such as moisture or oxygen from penetrating through the flexible substrate 330, and may planarize the surface of the flexible substrate 330.

In addition, the buffer layer 340 may be formed of at least one of inorganic substances such as silicon oxides ($SiO_x$), silicon nitrides ($SiN_x$), or aluminum oxides ($AlO_x$) and organic substances such as acryl or polyimides.

Figure 9C:
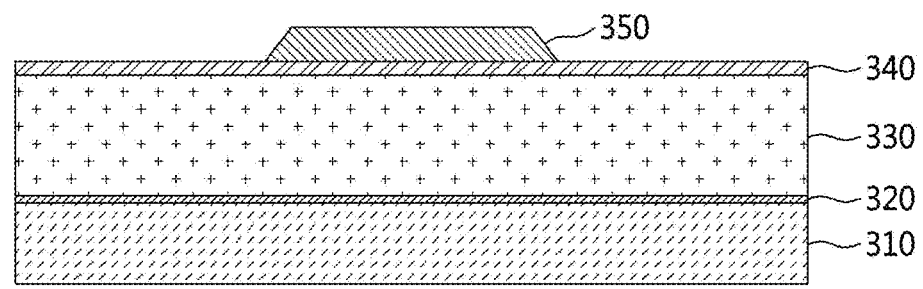

FIG. 9C is a cross-sectional view of a first gate electrode formed on a flexible substrate.

Referring to FIG. 9C, the first gate electrode 350 is formed on the flexible substrate 330.

The first gate electrode 350 may be formed by depositing a gate conductive film (not shown), forming a photoresist pattern on the gate conductive film, and selectively etching (patterning) the gate conductive film using the photoresist pattern as a mask.

The first gate electrode 350 may be formed to be spaced apart from the source and drain electrodes 381 and 382 formed on the oxide semiconductor layer 370 by 0.1 μm to 3 μm in the vertical direction.

Preferably, the interval (width) between the first gate electrode 350 and the source electrode 381 or the interval (width) between the first gate electrode 350 and a drain electrode 380 is 0.1 μm to 3 μm. When the interval (width) between the first gate electrode 350 and the source electrode 381 or the interval (width) between the first gate electrode 350 and the drain electrode 380 exceeds 3 μm, drain current may be reduced, increasing parasitic voltage. Thus, by setting the interval (width) between the first gate electrode 350 and the source electrode 381 or the interval (width) between the first gate electrode 350 and the drain electrode 380 to 3 μm or less, parasitic voltage may be reduced.

The first gate electrode 350 may include a metal or a metal oxide that is an electrically conductive material. Specifically, the first gate electrode 350 may include at least one of metals such as molybdenum (Mo), aluminum (Al), chromium (Cr), gold (Au), titanium (Ti), silver (Ag), nickel (Ni), neodymium (Nd), and copper (Cu) and metal oxides such as indium tin oxide (ITO), indium zinc oxide (IZO), and indium tin zinc oxide (ITZO), or the combinations thereof, without being limited thereto.

In addition, the first gate electrode 350 may be formed to have a single-layer or multilayer structure including the above-described materials.

Figure 9D:
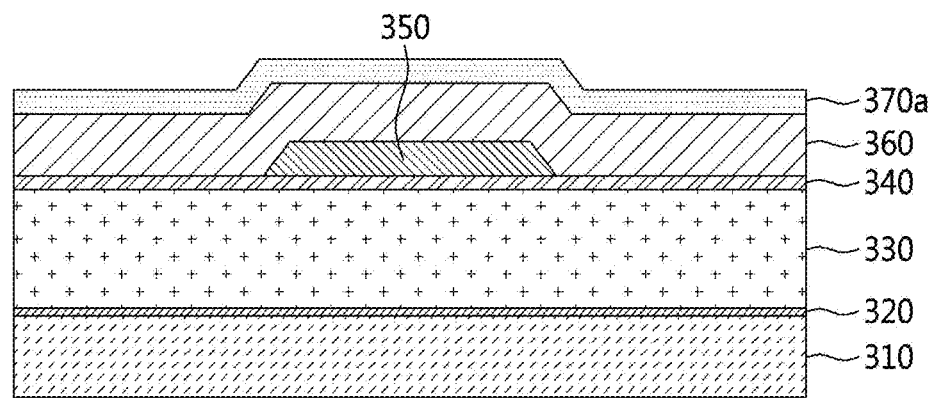

FIG. 9D is a cross-sectional view of a gate insulating film and an oxide semiconductor layer formed on a first gate electrode.

Referring to FIG. 9D, the gate insulating film 360 is formed on the first gate electrode 350, and the oxide semiconductor layer 370 is formed on the gate insulating film 360 so that the oxide semiconductor layer 370 corresponds to the first gate electrode 350.

The gate insulating film 360 may serve to insulate the oxide semiconductor layer 370 from the first gate electrode 350, and may be formed using a coating method.

As the gate insulating film 360, inorganic substances such as silicon oxides ($SiO_x$), silicon nitrides ($SiN_x$), titanium oxides ($TiO_x$), and hafnium oxides ($HfO_x$) and organic substances such as polyvinyl alcohol (PVA), polyvinylpyrrolidone (PVP), and polymethyl methacrylate (PMMA) may be used, without being limited thereto.

In addition, the gate insulating film 360 may be formed to have a single-layer or multilayer structure including the above-described materials.

The oxide semiconductor layer 370 may be formed on the gate insulating film 360. Specifically, to form the oxide semiconductor layer 370, an oxide semiconductor film 370a for forming the oxide semiconductor layer 370 is formed, a photoresist pattern is formed, and then patterning is performed using the photoresist pattern as a mask so that the oxide semiconductor film 370a corresponds to the first gate electrode 105.

The oxide semiconductor film 370a for forming the oxide semiconductor layer 370 may be formed using chemical vapor deposition (CVD) or physical vapor deposition (PVD).

The oxide semiconductor layer 107 may include at least one of indium gallium zinc oxide (IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc oxide (AZTO), without being limited thereto.

In addition, the oxide semiconductor layer 107 may be formed to have an amorphous or polycrystalline structure including the above-described materials.

The oxide semiconductor layer 370 may include a channel region in which a channel is formed and source and drain regions connected to the source and drain electrodes 381 and 382, respectively.

In addition, according to an embodiment, an etch stopper layer (not shown) may be formed on the oxide semiconductor layer 370.

The etch stopper layer may serve to protect the oxide semiconductor layer 370 from an etching solution, and may be formed on the oxide semiconductor layer 370 to ensure the stability of the oxide semiconductor layer 370.

Accordingly, the etch stopper layer may protect the oxide semiconductor layer 370 from an etching solution introduced during an etching process for forming the source and drain electrodes 381 and 382.

As the etch stopper layer, at least one of a silicon oxide film, a silicon nitride film, or a compound including the same may be used, without being limited thereto.

Figure 9E:
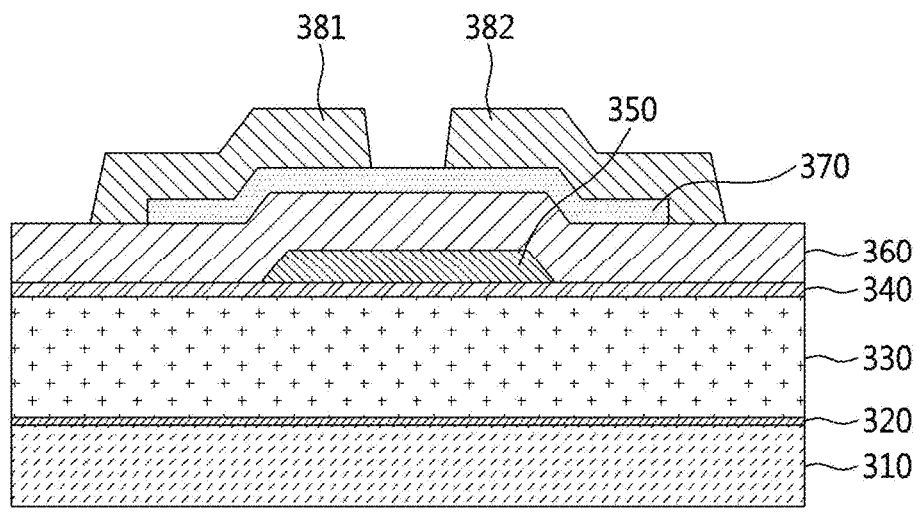

FIG. 9E is a cross-sectional view of a source electrode and a drain electrode formed on both sides of an oxide semiconductor layer, respectively.

Referring to FIG. 9E, the source and drain electrodes 381 and 382 are respectively formed on both sides of the oxide semiconductor layer 370.

The source and drain electrodes 381 and 382 may be formed on the oxide semiconductor layer 370 to be spaced apart from each other, and may each be electrically connected to the oxide semiconductor layer 370.

The source and drain electrodes 381 and 382 may be formed by depositing a conductive film (hereinafter, source/drain conductive film) for forming the source and drain electrodes 381 and 382 on the gate insulating film 360 including the oxide semiconductor layer 370, forming a photoresist pattern on the source/drain conductive film, and patterning the source/drain conductive film using the photoresist pattern as a mask.

The source and drain electrodes 381 and 382 may be formed of a metal material. For example, the source and drain electrodes 381 and 382 may be formed of any one of molybdenum (Mo), aluminum (Al), chromium (Cr), gold (Au), titanium (Ti), nickel (Ni), neodymium (Nd), and copper (Cu) or a combination thereof, without being limited thereto.

In addition, the source and drain electrodes 381 and 382 may be formed to have a single-layer or multilayer structure including the above-described material.

Figure 9F:
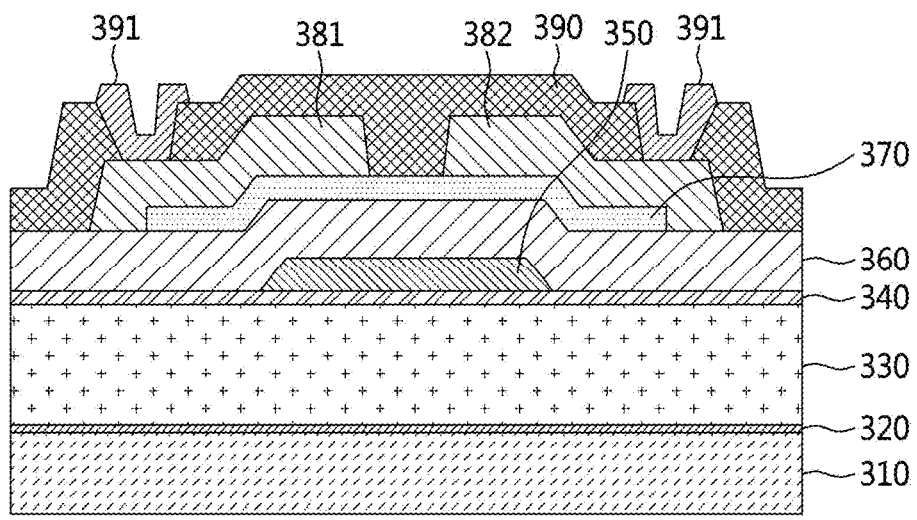

FIG. 9F is a cross-sectional view of a passivation layer formed on a source electrode and a drain electrode.

Referring to FIG. 9F, the passivation layer 390 is formed on the source and drain electrodes 381 and 382.

The passivation layer 390 may be formed to cover all of a gate insulating layer 360, the oxide semiconductor layer 370, and the source and drain electrodes 381 and 382.

The passivation layer 390 may be used as a protective layer, and may be formed of the same material as the gate insulating layer 360.

The passivation layer 390 may be formed using at least one of inorganic substances such as silicon oxides ($SiO_x$), silicon nitrides ($SiN_x$), titanium oxides ($TiO_x$), and hafnium oxides ($HfO_x$) and organic substances such as polyvinyl alcohol (PVA), polyvinylpyrrolidone (PVP), and polymethyl methacrylate (PMMA), without being limited thereto.

In addition, the passivation layer 390 may be formed to have a single-layer or multilayer structure including the above-described materials.

An oxide semiconductor thin film transistor may be formed using the method of fabricating a semiconductor device according to an embodiment of the present invention, which is described above.

In addition, the flexible substrate 330 may include one or more oxide semiconductor thin film transistor regions, the oxide semiconductor thin film transistor may be disposed in the oxide semiconductor thin film transistor regions, and the oxide semiconductor thin film transistor regions may be disposed in a matrix formed on the flexible substrate 330.

In addition, according to an embodiment, a pixel electrode 391 may be formed on the passivation layer 390.

The pixel electrode 391 is electrically connected to the source and drain electrodes 381 and 382, respectively, and serves to electrically connect the source and drain electrodes 381 and 382 with other external components.

The pixel electrode 391 may be formed of a metal material. For example, the pixel electrode 391 may include any one of molybdenum (Mo), aluminum (Al), chromium (Cr), gold (Au), titanium (Ti), nickel (Ni), neodymium (Nd), and copper (Cu).

In addition, according to an embodiment, a second gate electrode may be formed on the passivation layer 390.

The second gate electrode (not shown) may be formed at a position corresponding to the position of the first gate electrode 350, and may be formed to have the same size as the first gate electrode 350 or a size different from that of the first gate electrode 350.

In addition, the second gate electrode (not shown) may be formed using the same process and material as the first gate electrode 350, without being limited thereto.

The first gate electrode 350 and the second gate electrode (not shown) may be formed of a metal material capable of blocking light or a transparent metal material capable of transmitting light.

The first gate electrode 350 and the second gate electrode (not shown) may be electrically connected to each other to receive the same voltage.

When the same voltage is applied to the first gate electrode 350 and the second gate electrode (not shown), the width of a channel formed in the oxide semiconductor layer 370 may be increased, thereby increasing current passing through the source and drain electrodes 381 and 382.

According to the method of fabricating a semiconductor device according to an embodiment of the present invention, by including the first gate electrode 350 and the second gate electrode (not shown), low voltage driving is possible.

In addition, according to an embodiment, a polyimide layer may be formed on the passivation layer 390. Preferably, the polyimide layer is formed on the passivation layer 390 and the second gate electrode.

The oxide semiconductor thin film transistor according to the method of fabricating a semiconductor device according to an embodiment of the present invention is located between the flexible substrate 330 and the polyimide layer (not shown). That is, the oxide semiconductor thin film transistor is located at a neutral plane (NP) where compressive stress and tensile stress are equal to each other.

When the stretchable electronic device is bent, tensile stress is applied to the flexible substrate 330 and compressive stress is applied to the polyimide layer (not shown). In this case, since there is no tension or compression in the neutral plane (NP), substantially no deformation occurs.

Accordingly, even when the stretchable electronic device is bent, since the oxide semiconductor thin film transistor located at the neutral plane (NP) is not deformed, the electrical properties of the oxide semiconductor thin film transistor may be prevented from being degraded or damaged.

Figure 9G:
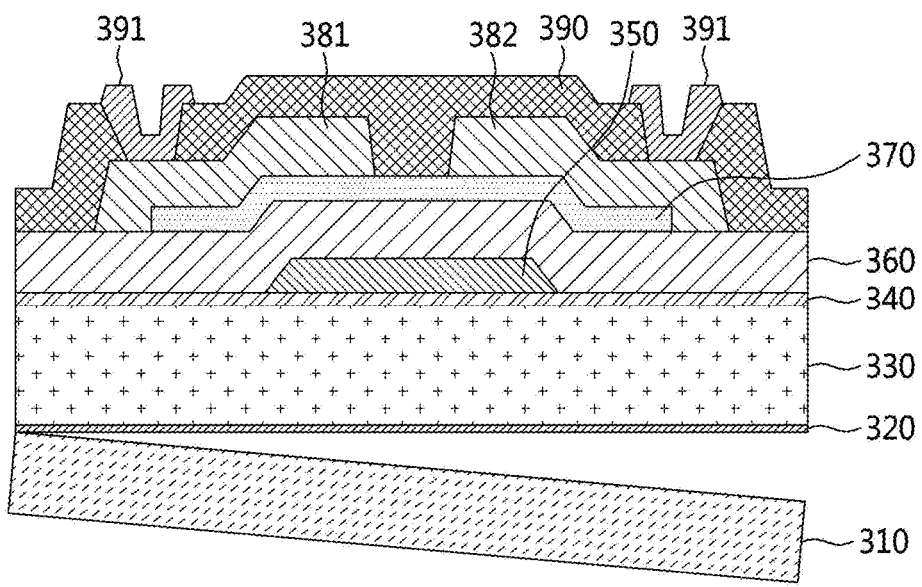

FIG. 9G is a cross-sectional view showing an experimental scene of releasing a first carrier substrate from a semiconductor device fabricated according to the method of fabricating a semiconductor device according to an embodiment of the present invention.

Referring to FIG. 9G, the first carrier substrate 310 may be removed from the semiconductor device (oxide semiconductor thin film transistor) according to an embodiment of the present invention.

For example, when fabrication of the semiconductor device (oxide semiconductor thin film transistor) is completed, or after a device, e.g., organic light-emitting diode (OLED), is formed on the oxide semiconductor thin film transistor, the first carrier substrate 310 may be physically removed using a separate apparatus.

The semiconductor device according to an embodiment of the present invention may be used to drive a display device, in particular the pixel device of a flexible display, e.g., an organic light-emitting device or a quantum dot organic light-emitting device.

Hereinafter, the stretchable substrate will be described in detail with reference to FIGS. 9H and 9I.

Figure 9H:
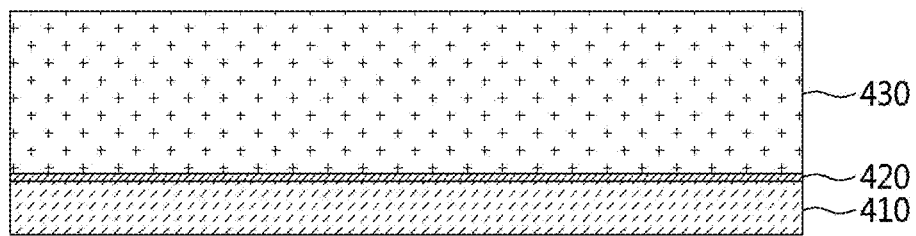
FIGS. 9H and 9I are cross-sectional views for explaining a method of fabricating a stretchable substrate according to an embodiment of the present invention.
Figure 9I:
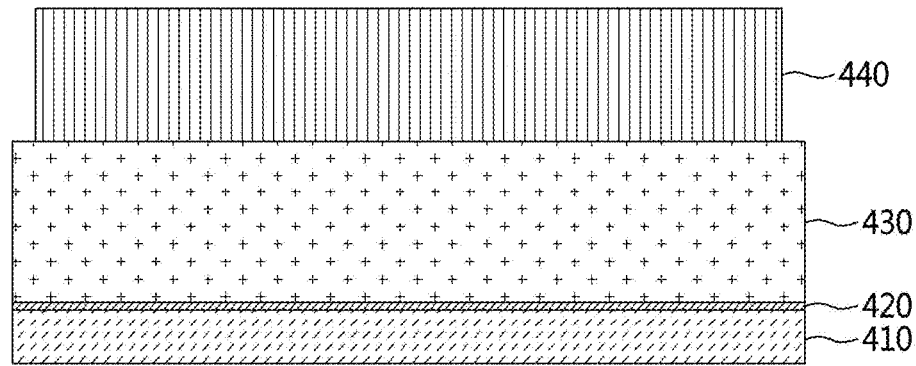

FIGS. 9H and 9I are cross-sectional views for explaining a method of fabricating a stretchable substrate according to an embodiment of the present invention.

In the method of fabricating a stretchable substrate according to an embodiment of the present invention, a stretchable substrate is formed on a second carrier substrate.

In addition, according to an embodiment, a supporting layer may be formed on the second carrier substrate, or an adhesive layer may be formed on the stretchable substrate.

FIG. 9H is a cross-sectional view of a supporting layer and a stretchable substrate formed on a second carrier substrate.

Referring to FIG. 9H, a supporting layer 420 may be formed on a second carrier substrate 410, and a stretchable substrate 430 may be formed on the supporting layer 420.

The supporting layer 420 may play the same role as the supporting layer shown in FIG. 9A, and may be formed using the same method or material as the supporting layer.

The supporting layer 420 does not necessarily need to be formed, and may or may not be formed on the second carrier substrate 410 as needed.

The stretchable substrate 430 is a substrate for supporting a semiconductor device, and may be a substrate having stretchability.

The stretchable substrate 430 may include at least one of polydimethylsiloxane (PDMS), polyester, polyurethane (PU), polyurethane acrylate (PUA), polyphenylmethylsiloxane, hexamethyldisiloxane, polyvinyl alcohol (PVA), epoxy resins, and EcoFlex.

FIG. 9I is a cross-sectional view of an adhesive layer formed on a stretchable substrate.

An adhesive layer 440 may be formed on the stretchable substrate 430, and a semiconductor device may be attached (transferred) to the adhesive layer 440.

By attaching (transferring) the semiconductor device to the adhesive layer 440, a stretchable electronic device may be fabricated without defects in the semiconductor device.

As the adhesive layer 440, at least one of thermosetting resins, photocurable resins, and tapes, preferably a polyimide (PI) double-sided tape, may be used, without being limited thereto.

The thermosetting resin or photocurable resin used as the adhesive layer 440 may be an acrylic resin or an epoxy resin. The thermosetting resin may include a thermal initiator that triggers curing by heat, and the photocurable resin may include a photoinitiator that triggers curing by light.

In addition, the adhesive layer 440 does not necessarily need to be formed, and may or may not be formed as needed.

For example, when polydimethylsiloxane (PDMS) is used as the stretchable substrate 430 and polyimide (PI) is used as the flexible substrate, adhesion between polydimethylsiloxane (PDMS) and polyimide (PI) is possible, and thus a semiconductor device may be attached (transferred) without the adhesive layer 440.

However, when the adhesive layer 440 is used, spacing caused by stress between films (between the stretchable substrate and the flexible substrate), which is generated during stretching, may be minimized.

Figure 10A:
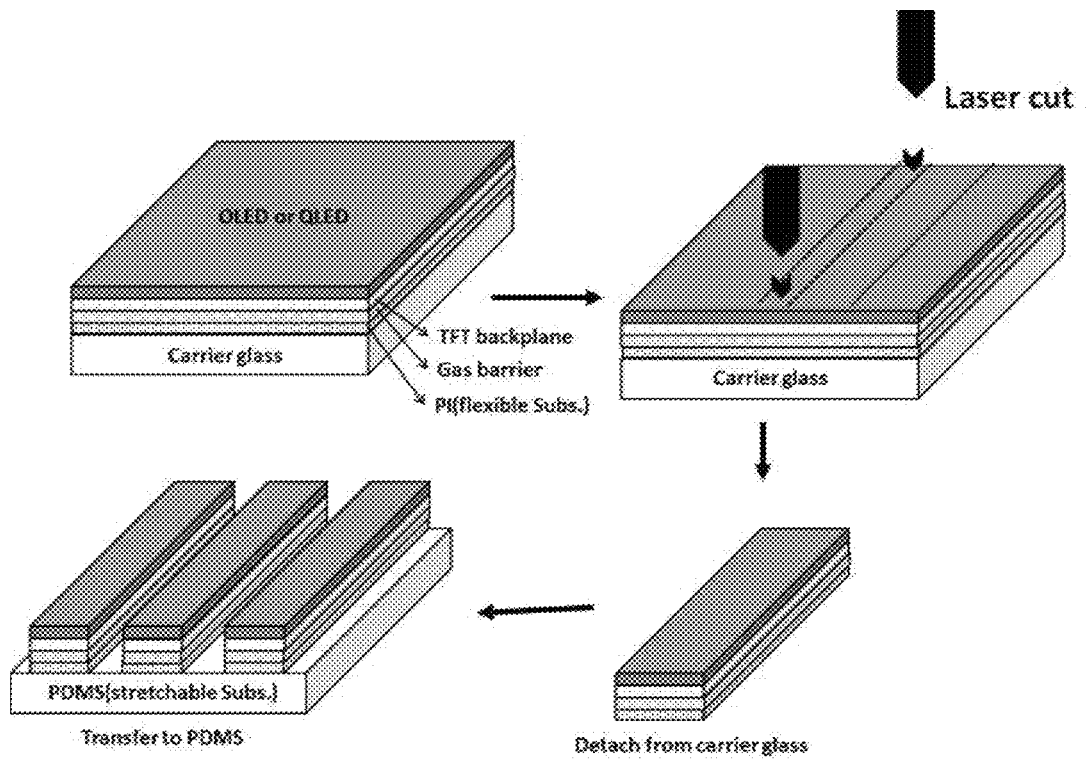
FIG. 10A includes three-dimensional views for explaining a method of fabricating a stretchable electronic device including an organic light-emitting device or a quantum dot light-emitting diode as a semiconductor device according to an embodiment of the present invention.
Figure 10B:
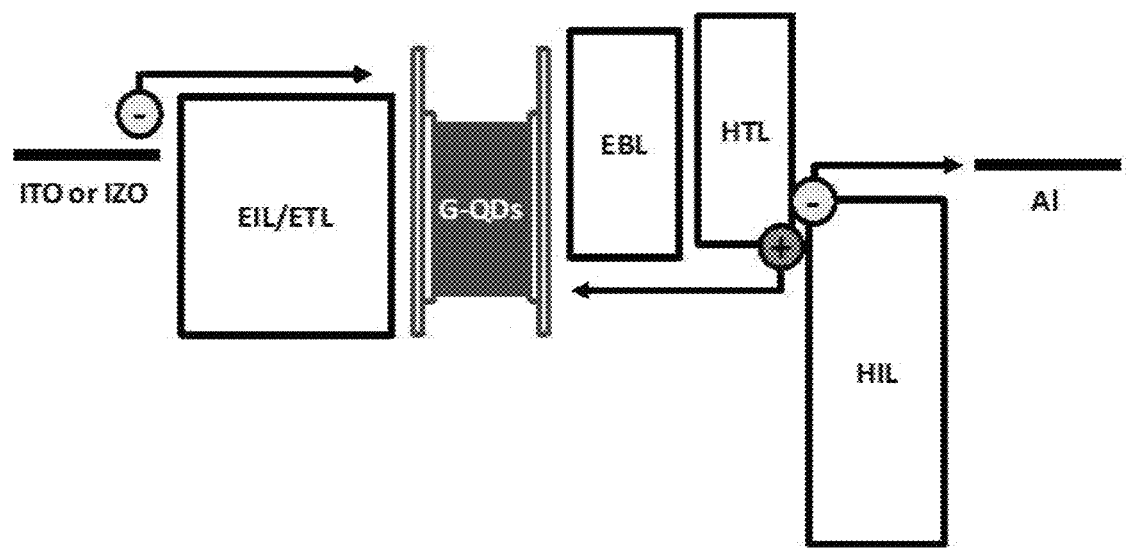
FIG. 10B includes images for explaining the band diagram of a quantum dot light-emitting diode included, as a semiconductor device, in a stretchable electronic device according to an embodiment of the present invention.

FIG. 10A includes three-dimensional views for explaining a method of fabricating a stretchable electronic device including an organic light-emitting device or a quantum dot light-emitting diode as a semiconductor device according to an embodiment of the present invention, and FIG. 10B includes images for explaining the band diagram of a quantum dot light-emitting diode used as a semiconductor device according to an embodiment of the present invention.

FIG. 10A is the same as the method of fabricating a stretchable electronic device according to an embodiment of the present invention shown in FIGS. 1A to 5, and thus, duplicate components will not be described.

Referring to FIG. 10A, as in FIG. 1A, an organic light-emitting device or a quantum dot light-emitting diode may be formed on a carrier substrate; as in FIG. 2, the organic light-emitting device or the quantum dot light-emitting diode may be separated; as in FIG. 3, the carrier substrate may be removed (Detach from carrier glass); and as in FIGS. 4 and 5, the separated organic light-emitting device or quantum dot light-emitting diode may be transferred onto a stretchable substrate (Transfer to PDMS).

The structures and layer configurations of the organic light-emitting device and the quantum dot light-emitting diode will be described in detail with reference to FIG. 10B.

In addition, according to an embodiment, the stretchable electronic device including the organic light-emitting device or the quantum dot light-emitting diode may further include a gas barrier and a thin film transistor (TFT) backplane on the top of the flexible substrate.

The gas barrier may include inorganic thin films including at least one of silicon oxide ($SiO_2$), silicon nitrides ($SiN_x$), silicon oxynitride (SiON), and alumina ($Al_2O_3$); polymer thin films 24 including at least one of polyethylene terephthalate, polyvinylidene fluoride, polymethyl methacrylate, and polyimide; or complex films in which the inorganic thin film and the polymer thin film are laminated.

By forming the gas barrier on the flexible substrate, gas permeability resistance may be obtained, whereby the organic light-emitting device or the quantum dot light-emitting diode may be protected from moisture or oxygen.

The thin film transistor (TFT) backplane may include at least one thin film transistor corresponding to the organic light-emitting device or the quantum dot light-emitting diode to operate the organic light-emitting device or the quantum dot light-emitting diode.

Referring to FIG. 10B, a quantum dot light-emitting diode used as a semiconductor device may include a negative electrode, a first charge generating junction layer formed on the negative electrode, a quantum dot light-emitting layer formed on the first charge generating junction layer, a hole transport layer (HTL) formed on the quantum dot light-emitting layer, a second charge generating junction layer formed on the hole transport layer, and a positive electrode formed on the second charge generating junction layer.

In addition, the first charge generating junction layer and the second charge generating junction layer may have a layer-by-layer structure in which a p-type semiconductor layer and an n-type semiconductor layer are sequentially formed.

Due to the layer-by-layer structure, in the first charge generating junction layer and the second charge generating junction layer, electrons may tunnel from the highest occupied molecular orbital (HOMO) to the lowest unoccupied molecular orbital (LUMO) due to band bending. In this tunneling process, charge carriers (electrons or holes) are supplied to a quantum dot light-emitting diode. In the case of the first charge generating junction layer disposed on a negative electrode, the supplied charge carriers are electrons. In the case of the second charge generating junction layer disposed on a positive electrode, the supplied charge carriers are holes.

In addition, in that the first charge generating junction layer and the second charge generating junction layer supply charge carriers, the first charge generating junction layer and the second charge generating junction layer may have a similar effect to containing metal between electrodes (a negative electrode and a positive electrode).

Injecting electrons or holes from a negative or positive electrode depends critically on the work function of a negative or positive electrode material. Cleaning a negative electrode or preparing the surface of the negative electrode before forming the negative electrode may have a strong effect on the work function of the negative electrode, and may also have a strong effect on an injection barrier.

The first charge generating junction layer may improve the charge injection characteristics of the quantum dot light-emitting diode by separating the charge injection characteristics of the quantum dot light-emitting diode from the work function of the negative electrode, and the second charge generating junction layer may improve the charge injection characteristics of the quantum dot light-emitting diode by separating the charge injection characteristics of the quantum dot light-emitting diode from the work function of the positive electrode.

In addition, in the second charge generating junction layer, an n-type semiconductor layer may be formed in a positive electrode direction, and a p-type semiconductor layer may be formed on the quantum dot light-emitting layer so that switching between hole transport and electron transport for charge transport is allowed.

The first charge generating junction layer and the second charge generating junction layer may be formed using a solution process. Specifically, the first charge generating junction layer may be formed using any one solution process selected from spin-coating, slot-die coating, inkjet printing, spray coating, and dip coating.

The first charge generating junction layer and the second charge generating junction layer are preferably formed using spin-coating. In spin coating, a predetermined amount of a solution is dropped onto a substrate while the substrate is rotated at a high speed. At this time, the substrate is coated with the solution by centrifugal force generated during rotation.

Since the first charge generating junction layer and the second charge generating junction layer are formed using a solution process, a large-area process may be allowed, process time may be shortened, and limitation on the semiconductor properties of upper and lower electrodes (positive and negative electrodes) may be reduced.

When the first charge generating junction layer and the second charge generating junction layer are formed, charges are generated at the interface between the p-type and n-type semiconductor layers. Thus, even when metal materials having different work functions are used as electrodes, function is not affected. Accordingly, since charges are generated at the interface between the p-type and n-type semiconductor layers by the first charge generating junction layer and the second charge generating junction layer, charge generation and injection may be stabilized.

In addition, the first charge generating junction layer may serve as an electron transport layer (ETL) or an electron injection layer (EIL), and the second charge generating junction layer may serve as an exciton blocking layer (EBL) or a hole injection layer (HIL), without being limited thereto.

As the negative and positive electrodes, commonly used electrode materials may be used. Preferably, a transparent electrode such as indium tin oxide (ITO) or indium zinc oxide (IZO) is used as the negative electrode, and aluminum (Al) is used as the positive electrode.

Quantum dots used in the quantum dot light-emitting layer may be semiconductor nanoparticles. Preferably, in the quantum dot light-emitting layer, one or more semiconductor materials selected from group II-VI semiconductor compounds, group III-V semiconductor compounds, group IV-VI semiconductor compounds, group IV elements or compounds, and combinations thereof are used. More preferably, in the quantum dot light-emitting layer, CdSe/CdS/ZnS is used.

In FIG. 10B, green quantum dots (G-QDs) are described as an example, but the present invention is not limited thereto and quantum dots of various colors may be used.

Quantum dots having a nanometer-scale diameter emit light when electrons in an unstable state descend from a conduction band to a valence band. The diameter of quantum dot particles is proportional to the wavelength of light generated. That is, as the diameter of quantum dot particles decreases, the wavelength of light generated decreases. In contrast, as the diameter of quantum dot particles increases, the wavelength of light generated increases.

This is a unique electrical and optical characteristic that differs from conventional semiconductor materials. Accordingly, by adjusting the size of quantum dots, it is possible to represent visible light of a desired wavelength. In addition, by changing the size of quantum dots or quantum dot components, it is possible to implement a variety of colors at the same time.

The quantum dot light-emitting diode may realize a desired natural color by controlling the size of quantum dots. In addition, the quantum dot light-emitting diode may exhibit good color reproducibility and luminance compared to light-emitting diodes.

In addition, an organic light-emitting device may be used as a semiconductor device. The organic light-emitting device may have the same structure and materials as the quantum dot light-emitting diode shown in FIG. 10B, except that the organic light-emitting device uses a light-emitting layer material different from that of the quantum dot light-emitting diode.

The light-emitting layer of the organic light-emitting device used as a semiconductor device may include organic light-emitting layers including low molecular weight organic substances or high molecular weight organic substances.

The organic light-emitting device has a short response time, a large contrast ratio, a wide viewing angle, and low power consumption. In addition, the organic light-emitting device provides a self-luminous display in which a light source is mounted in a panel. Thus, the organic light-emitting device may have excellent brightness and power consumption efficiency, and may be slimmed down by eliminating a separate backlight.

Hereinafter, the characteristics of a stretchable electronic device according to an embodiment of the present invention will be described with reference to FIGS. 11A to 19B.

Figure 11A:
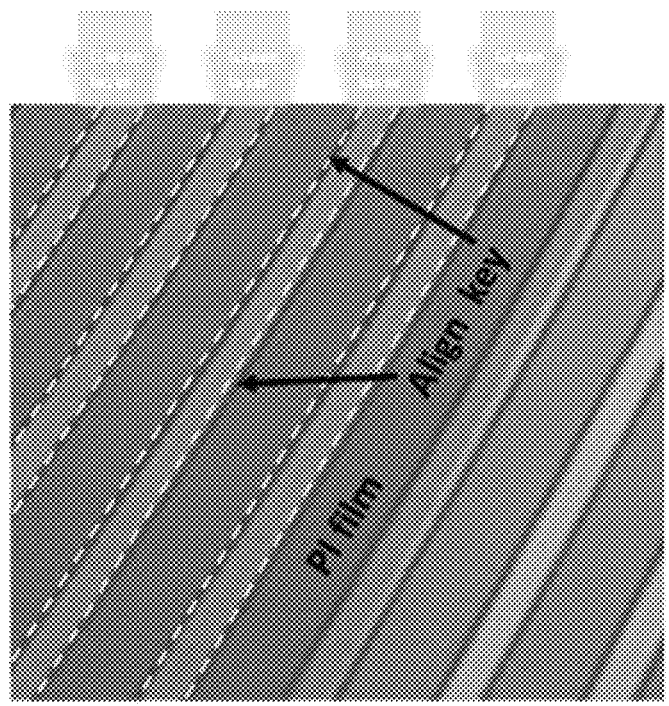
FIGS. 11A and 11B illustrate a process for forming semiconductor device array patterns as in FIG. 2A.
Figure 11B:
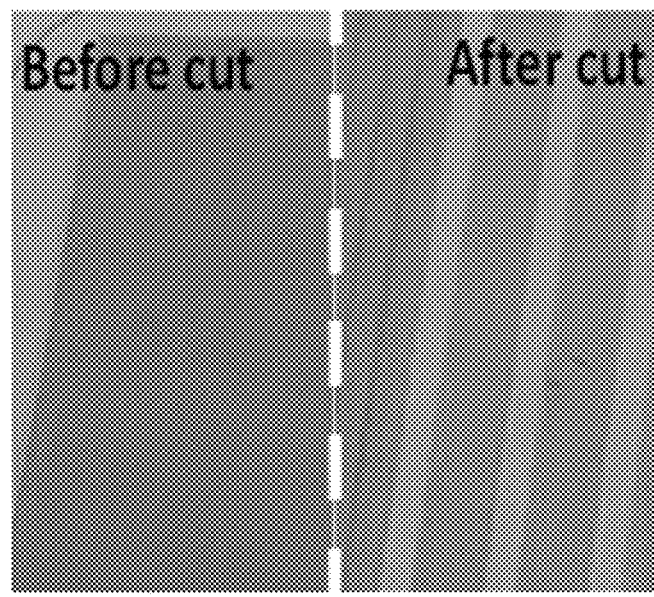

FIGS. 11A and 11B are images showing a process of forming semiconductor device array patterns as in FIG. 2A.

Referring to FIG. 11A, in the method of fabricating a stretchable electronic device according to an embodiment of the present invention, semiconductor device array patterns may be separated using an alignment key and a laser beam.

In FIG. 11B, semiconductor device array patterns are separated using an alignment key and a laser beam.

Figure 12A:
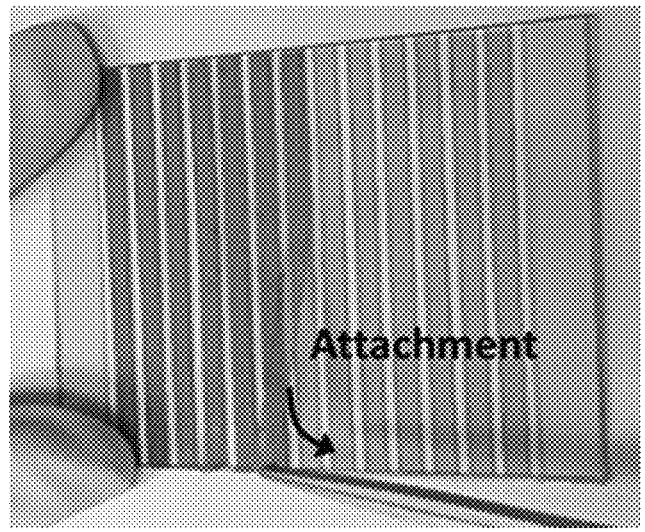
FIG. 12A illustrates a process for transferring semiconductor device array patterns to a stretchable substrate as in FIG. 4A.

FIG. 12A is an image showing a process of transferring semiconductor device array patterns onto a stretchable substrate as in FIG. 4.

Figure 12B:
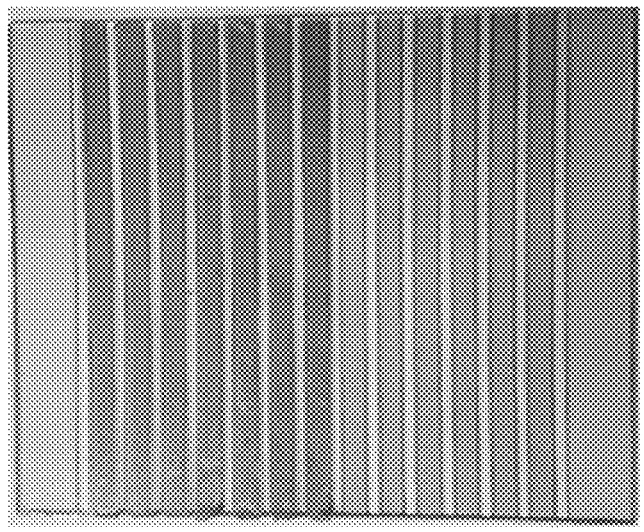
FIGS. 12B and 12C show semiconductor device array patterns transferred onto a stretchable substrate as in FIG. 5.
Figure 12C:
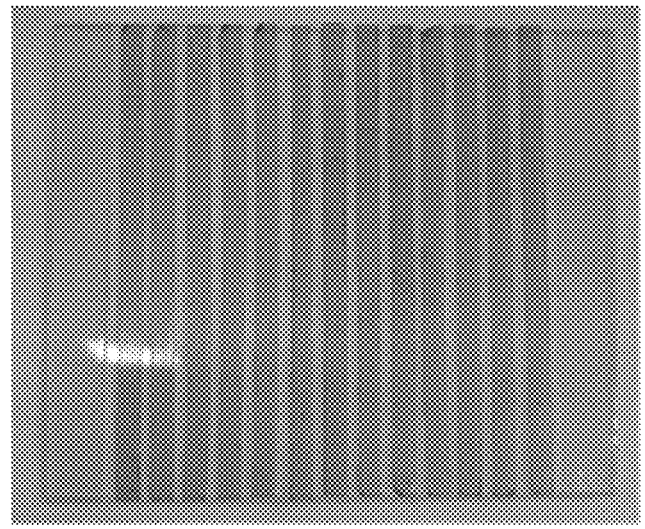

FIGS. 12B and 12C are images showing semiconductor device array patterns transferred onto a stretchable substrate as in FIG. 5.

Referring to FIGS. 12A to 12C, it can be seen that semiconductor device array patterns are easily transferred onto a stretchable substrate.

Figure 13A:
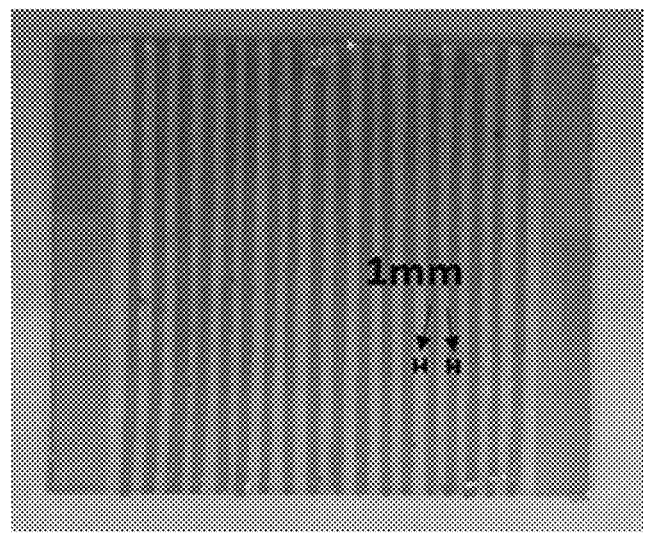
FIGS. 13A to 13C illustrate stretchable substrates onto which semiconductor device array patterns having different widths are transferred.
Figure 13B:
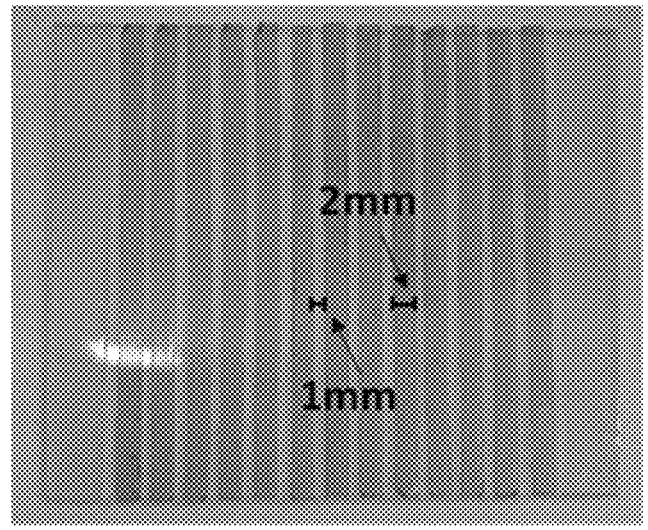
Figure 13C:
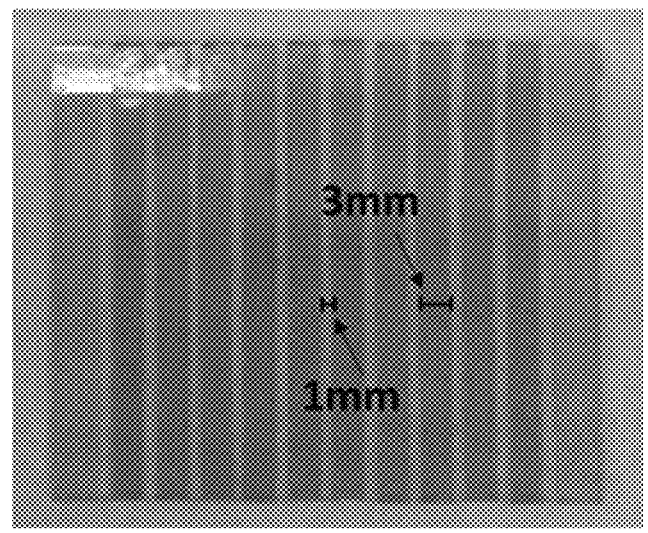

FIGS. 13A to 13C illustrate stretchable substrates onto which semiconductor device array patterns having different widths are transferred.

In FIG. 13A, semiconductor device array patterns having a width of 1 mm are arranged at intervals of 1 mm. In FIG. 13B, semiconductor device array patterns having a width of 2 mm are arranged at intervals of 1 mm. In FIG. 13C, semiconductor device array patterns having a width of 3 mm are arranged at intervals of 1 mm.

Referring to FIGS. 13A to 13C, it can be seen that semiconductor device array patterns having various widths and intervals may be transferred onto a stretchable substrate.

Figure 14A:
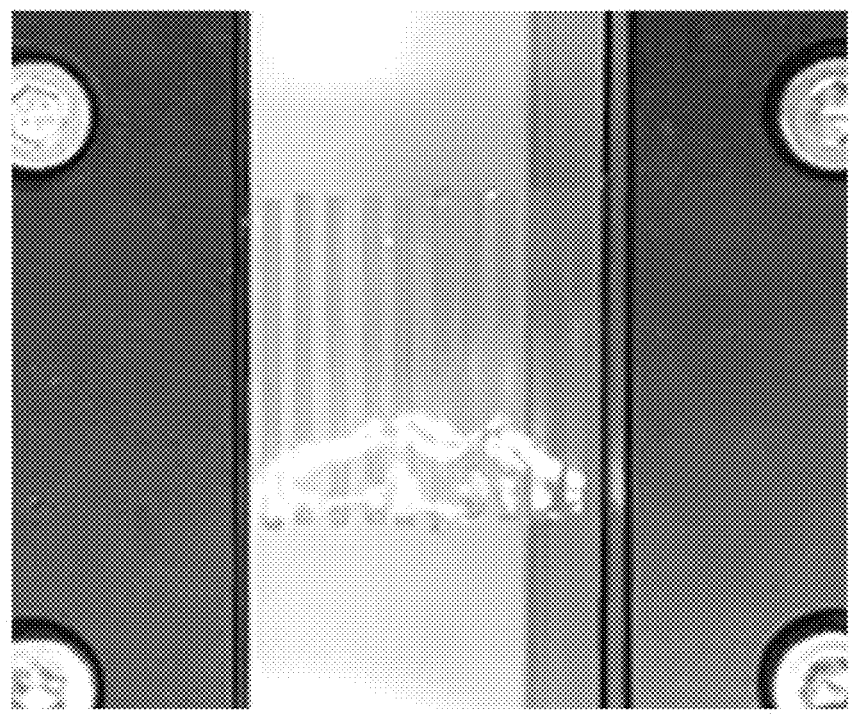
FIGS. 14A and 14B are images before and after stretching semiconductor device array patterns transferred onto a stretchable substrate.
Figure 14B:
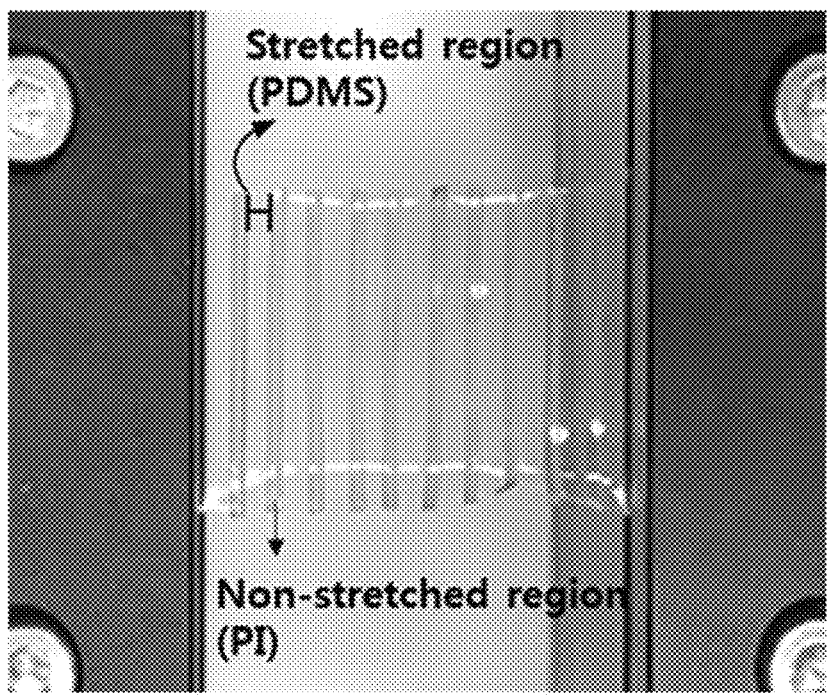

FIGS. 14A and 14B are images before and after stretching semiconductor device array patterns transferred onto a stretchable substrate.

In FIGS. 14A and 14B, semiconductor device array patterns are formed on a flexible substrate formed of polyimide (PI), and polydimethylsiloxane (PDMS) is used as a stretchable substrate.

Referring to FIGS. 14A and 14B, it can be confirmed that non-stretchable regions where semiconductor device array patterns transferred onto a stretchable substrate are formed are not stretched, and only stretchable regions where semiconductor device array patterns are not formed are stretched.

Figure 15A:
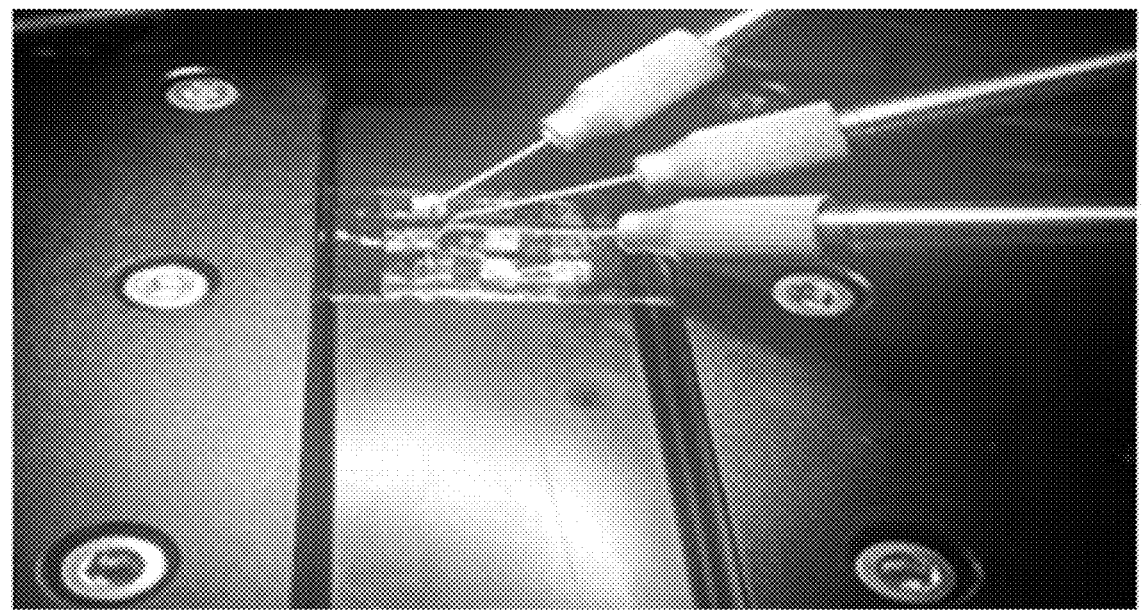
FIG. 15A shows an experimental scene of measuring electrical properties in a state wherein semiconductor device array patterns are transferred onto a stretchable substrate.
Figure 15B:
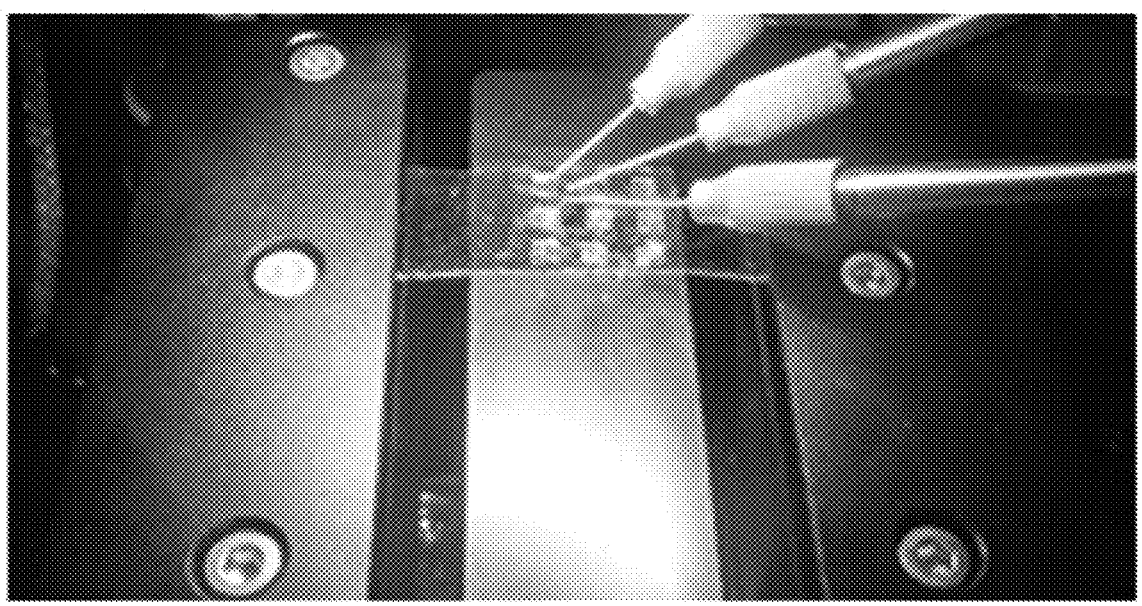
FIG. 15B shows an experimental scene of measuring electrical properties in a state wherein a stretchable substrate onto which semiconductor device array patterns have been transferred is stretched by 70%.

FIG. 15A shows an experimental scene of measuring electrical properties in a state wherein semiconductor device array patterns are transferred onto a stretchable substrate, and FIG. 15B shows an experimental scene of measuring electrical properties in a state wherein a stretchable substrate onto which semiconductor device array patterns have been transferred is stretched by 70%.

Figure 16A:
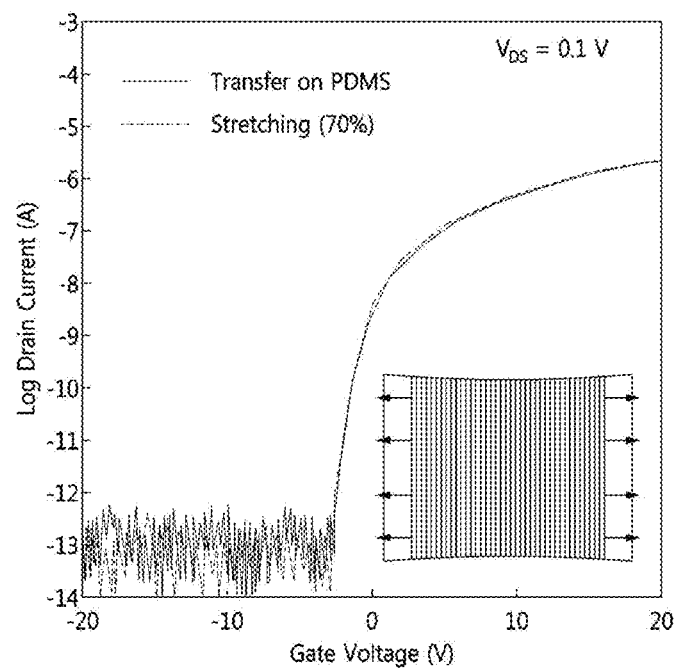
FIG. 16A is a graph showing log drain current-gate voltage characteristics and parameter values in a state (Transfer on PDMS) wherein stripe-shaped semiconductor device array patterns are transferred.
Figure 16B:
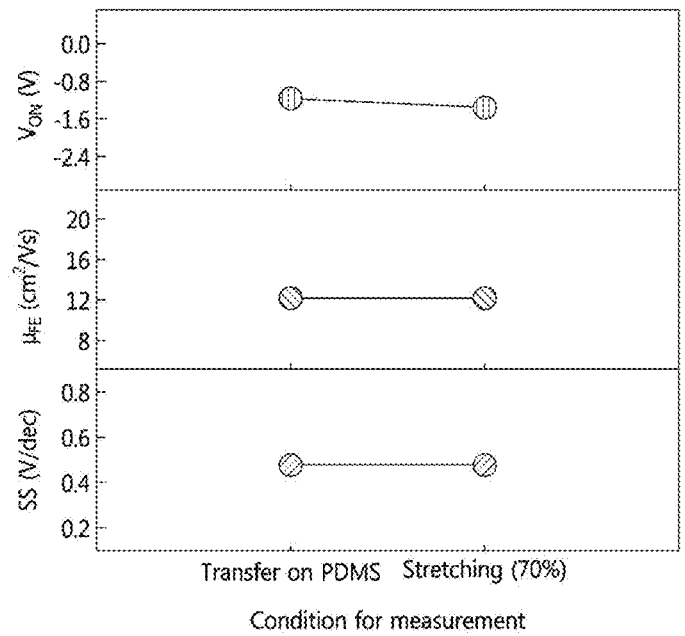
FIG. 16B is a graph showing log drain current-gate voltage characteristics and parameter values in a state (Stretching (70%)) wherein a stretchable substrate onto which stripe-shaped semiconductor device array patterns have been transferred is stretched by 70%.

FIG. 16A is a graph showing log drain current-gate voltage characteristics and parameter values in a state (Transfer on PDMS) wherein stripe-shaped semiconductor device array patterns are transferred, and FIG. 16B is a graph showing log drain current-gate voltage characteristics and parameter values in a state (Stretching (70%)) wherein a stretchable substrate onto which stripe-shaped semiconductor device array patterns have been transferred is stretched by 70%.

In FIG. 16A, in $V_{DS}$, electrical properties when the same applied voltage ($V_{GS}$) is applied to first and second gate electrodes are referred to as dual sweep (DS), $V_{DS}$=0.1V indicates that an applied voltage of 0.1 V is applied to the first and second gate electrodes, and a drain voltage or a gate voltage may vary depending on a driving environment.

Referring to FIGS. 16A and 16B, since non-stretchable regions where striped and rectangular semiconductor device array patterns are formed are not stretched and only stretchable regions where striped and rectangular semiconductor device array patterns are not formed are stretched, there is no change in the drain current-gate voltage characteristics of a stretchable electronic device in a state wherein the semiconductor device array patterns are transferred onto a stretchable substrate and in a state wherein the stretchable substrate onto which the semiconductor device array patterns have been transferred is stretched by 70%.

FIG. 16B is a comparison graph showing the characteristic change of the turn-on voltage ($V_{ON}$), field effect mobility ($\mu_{FE}$), and sub-threshold swing (SS) of a stretchable electronic device in a state (Condition for measurement) wherein semiconductor devices on a stretchable substrate and the stretchable substrate are stretched by 70% (Transfer on PDMS Stretching (70%)).

When stretching and bending are performed along the x-axis and y-axis, the direction of deformation (strain) applied to semiconductor devices may be parallel or perpendicular to source/drain electrodes. Accordingly, the deterioration phenomenon of the semiconductor devices may be different.

Referring to FIG. 16B, in the stretchable electronic device according to an embodiment of the present invention, it can be seen that, regardless of orientation, the characteristics of the semiconductor device are preserved.

Therefore, the stretchable electronic device according to an embodiment of the present invention is suitable for application to a stretchable semiconductor device and array, a display, or a sensor array.

Figure 17A:
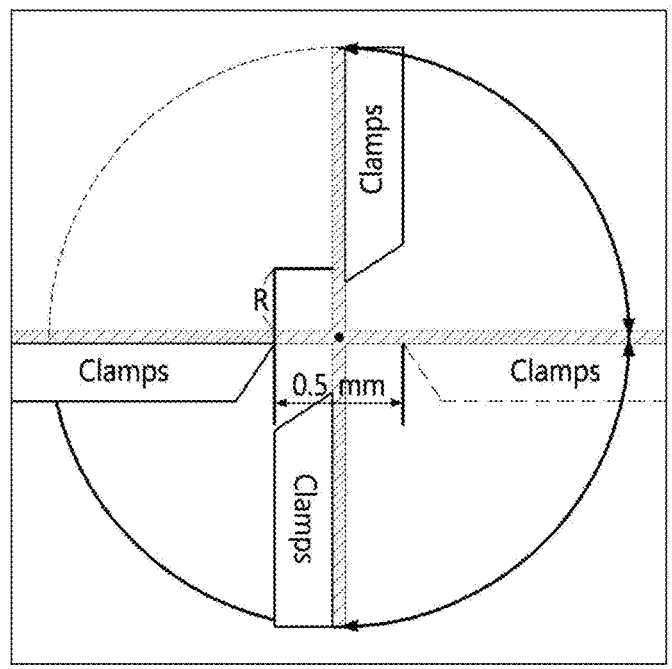
FIGS. 17A and 17B are images showing bending test equipment and reliability test equipment for a stretchable electronic device according to an embodiment of the present invention.
Figure 17B:
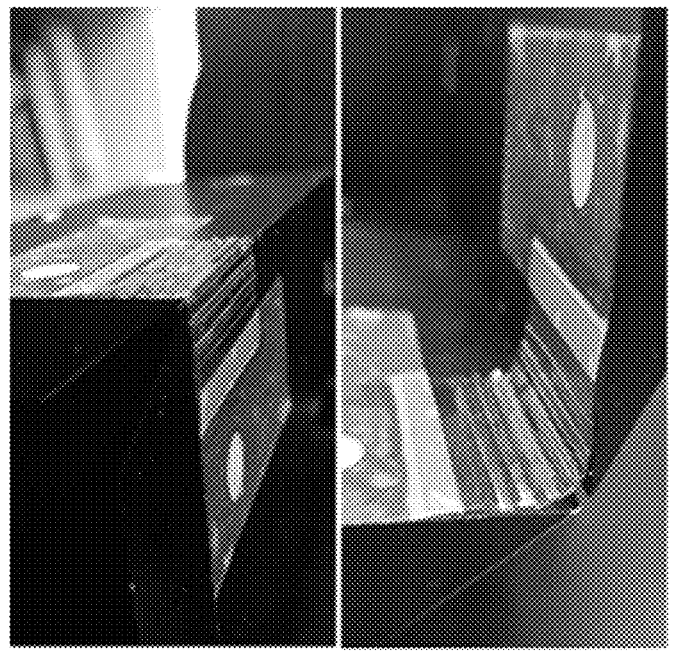

FIGS. 17A and 17B are images showing bending test equipment and reliability test equipment for a stretchable electronic device according to an embodiment of the present invention.

FIG. 17A is a cross-sectional view of bending test equipment, and FIG. 17B shows an experimental scene of applying bending stress to stretchable thin film transistor arrays placed on the bending test equipment.

In the bending test equipment shown in FIGS. 17A and 17B, a bending angle (θ) may be changed from 0° to ±90°, and a stretchable electronic device may be placed between two clamps and a reliability test for bending stress may be performed.

In addition, when a bending test was performed, bending time (s) (the number of bending) was set differently to 0 (initial), 1,000, 3,000, 5,000, and 10,000, and a bending radius was fixed at 0.32 mm so that bending angles were −90° and +90°.

Figure 18A:
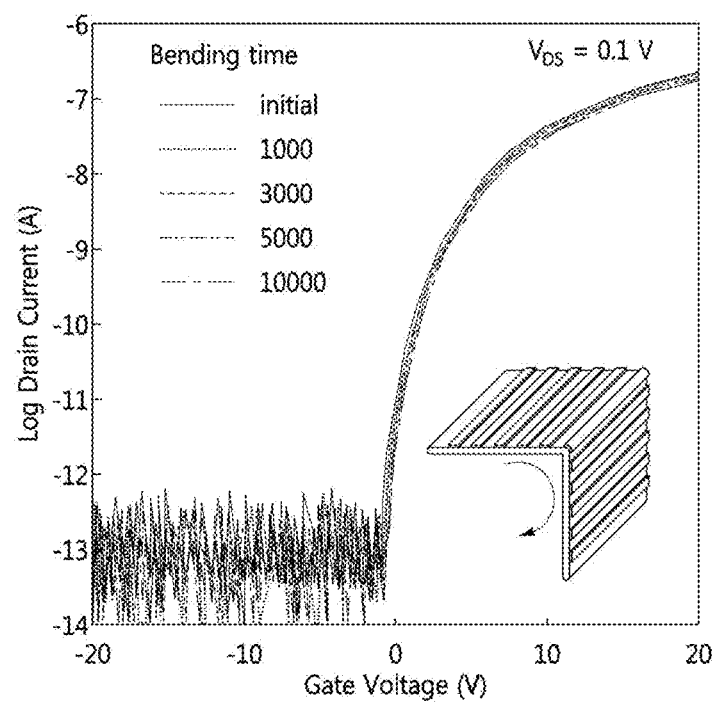
FIGS. 18A and 18B are graphs showing the drain current-gate voltage characteristics and the parameter values of a stretchable electronic device according to an embodiment of the present invention after performing a bending test at a bending angle of −90° using the equipment described in FIGS. 17A and 17B.
Figure 18B:
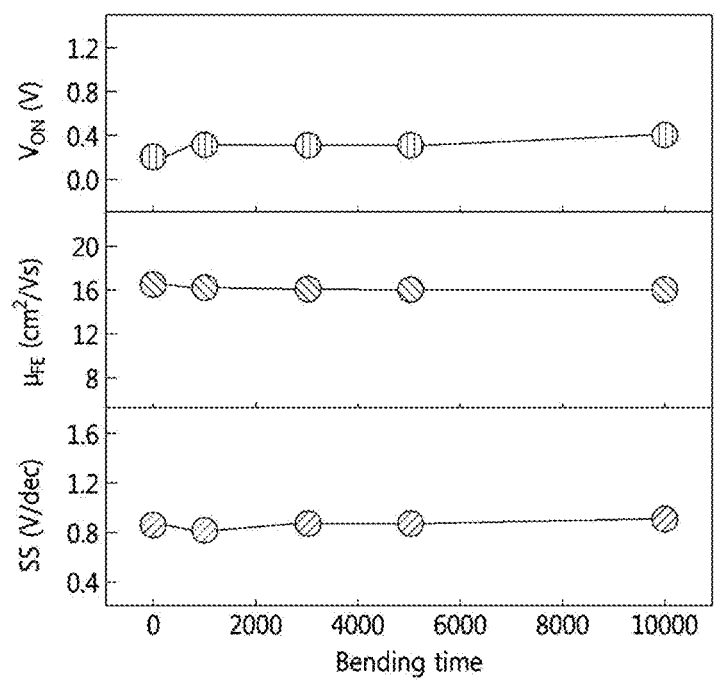

FIGS. 18A and 18B are graphs showing the drain current-gate voltage characteristics and the parameter values of a stretchable electronic device according to an embodiment of the present invention after performing a bending test at a bending angle of −90° using the equipment described in FIGS. 17A and 17B.

Specifically, in FIGS. 18A and 18B, bending is performed in the tensile direction at a bending angle of −90°.

Figure 19A:
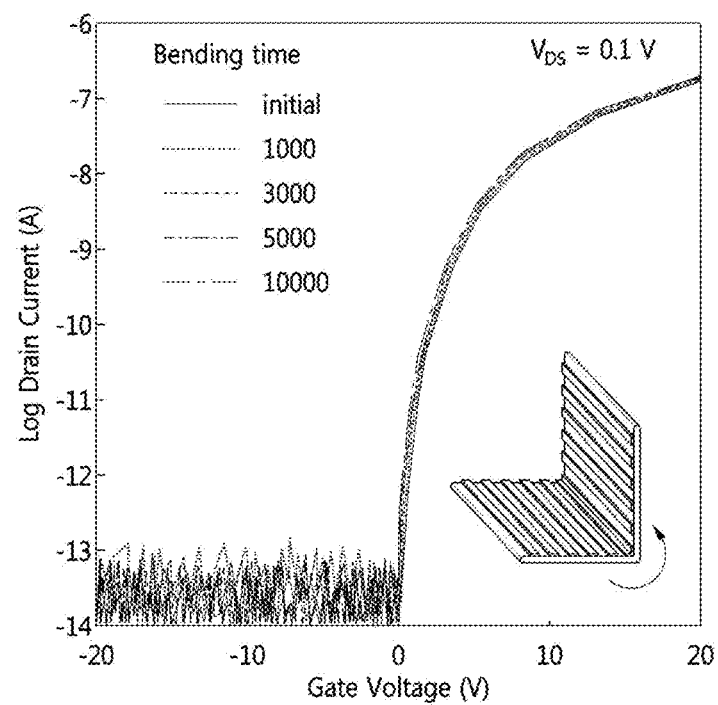
FIGS. 19A and 19B are graphs showing the drain current-gate voltage characteristics and the parameter values of a stretchable electronic device according to an embodiment of the present invention after performing a bending test at a bending angle of +90° using the equipment described in FIGS. 17A and 17B.
Figure 19B:
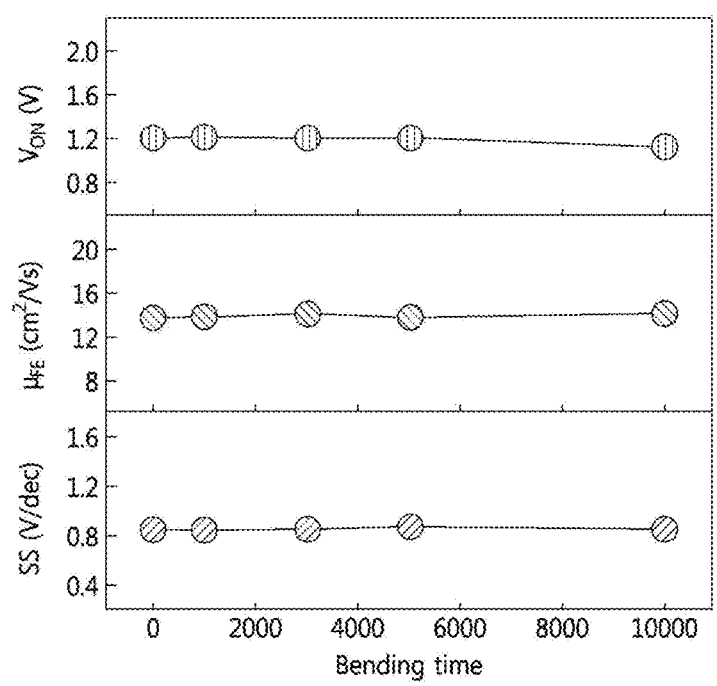

FIGS. 19A and 19B are graphs showing the drain current-gate voltage characteristics and the parameter values of a stretchable electronic device according to an embodiment of the present invention after performing a bending test at a bending angle of +90° using the equipment described in FIGS. 17A and 17B.

Specifically, in FIGS. 19A and 19B, bending is performed in the compressive direction at a bending angle of +90°.

In FIGS. 18A and 19A, in $V_{DS}$, electrical properties when the same applied voltage ($V_{Gs}$) is applied to first and second gate electrodes are referred to as dual sweep (DS), $V_{Ds}$=0.1V indicates that an applied voltage of 0.1 V is applied to the first and second gate electrodes, and a drain voltage or a gate voltage may vary depending on a driving environment.

Referring to FIGS. 18A and 19A, since non-stretchable regions where striped and rectangular semiconductor device array patterns are formed are not stretched and only stretchable regions where striped and rectangular semiconductor device array patterns are not formed are stretched, the semiconductor device array patterns are not subjected to bending stress, and thus there is no change in drain current-gate voltage characteristics according to bending time.

FIG. 18B is a comparison graph showing the characteristic change of the turn-on voltage ($V_{ON}$), field effect mobility ($\mu_{FE}$), and sub-threshold swing (SS) of a stretchable electronic device depending on the number of bending (bending time) when bending is performed at a bending angle of −90° in the tensile direction or at a bending angle of +90° in the compressive direction.

FIGS. 18B to 19B are graphs comparing a state before bending and a state when bending is performed 1,000, 3,000, 5,000, and 10,000 times.

When stretching and bending are performed along the x-axis and y-axis, the direction of deformation (strain) applied to semiconductor devices may be parallel or perpendicular to source/drain electrodes. Accordingly, the deterioration phenomenon of the semiconductor devices may be different.

Referring to FIG. 18B to FIG. 19B, in the stretchable electronic device according to an embodiment of the present invention, it can be seen that, regardless of orientation, the characteristics of the semiconductor device are preserved.

Therefore, the stretchable electronic device according to an embodiment of the present invention is suitable for application to a stretchable semiconductor device and array, a display, or a sensor array.

Although the present invention has been described through limited examples and figures, the present invention is not intended to be limited to the examples. Those skilled in the art will appreciate that various modifications, additions, and substitutions are possible, without departing from the scope and spirit of the invention.

Therefore, the scope of the present invention should not be limited by the embodiments, but should be determined by the following claims and equivalents to the following claims.

DESCRIPTION OF SYMBOLS

100: STRETCHABLE ELECTRONIC DEVICE
110, 310: FIRST CARRIER SUBSTRATE
120: FLEXIBLE SUBSTRATE
130: SEMICONDUCTOR DEVICES
140: SEMICONDUCTOR DEVICE ARRAY PATTERNS
141: FIRST SEMICONDUCTOR DEVICE ARRAY PATTERN
142: SECOND SEMICONDUCTOR DEVICE ARRAY PATTERN
150: STRETCHABLE SUBSTRATE
161: NON-STRETCHABLE REGIONS
162: STRETCHABLE REGIONS
320, 420: SUPPORTING LAYER
330: FLEXIBLE SUBSTRATE
340: BUFFER LAYER
350: GATE ELECTRODE
360: GATE INSULATING FILM
370a: OXIDE SEMICONDUCTOR FILM
370: OXIDE SEMICONDUCTOR LAYER
381: SOURCE ELECTRODE
382: DRAIN ELECTRODE
390: PASSIVATION LAYER
391: PIXEL ELECTRODE
410: SECOND CARRIER SUBSTRATE
430: STRETCHABLE SUBSTRATE
440: ADHESIVE LAYER

The invention claimed is:

1. A method of fabricating a stretchable electronic device, the method comprising:
a step of forming a plurality of semiconductor devices on a first carrier substrate;
a step of forming semiconductor device array patterns by separating semiconductor device arrays each comprising the semiconductor devices;
a step of releasing the semiconductor device array patterns from the first carrier substrate;
a step of forming a stretchable substrate on a second carrier substrate; and
a step of transferring the released semiconductor device array patterns onto the stretchable substrate,
wherein, in the stretchable electronic device, the semiconductor device array patterns are disposed on the stretchable substrate,
wherein, in the step of transferring, the semiconductor device array patterns are transferred onto the stretchable substrate at an interval of 500 μm associated with a reduction for stretchable regions to 5,000 μm associated with a reduction for the number of semiconductor device array patterns,
wherein the stretchable electronic device includes the stretchable regions and non-stretchable regions,
wherein the non-stretchable regions are regions where the semiconductor device array patterns are formed,
wherein the semiconductor device array patterns have a width of 500 μm, and
wherein the semiconductor device array patterns include a continuous flexible substrate with more than one of the plurality of semiconductor devices.

2. The method according to claim 1, wherein the semiconductor device array patterns are formed to have at least one of a stripe shape, a polygonal shape, and a circular shape.

3. The method according to claim 1, wherein the semiconductor devices comprise at least one of a thin film transistor, a capacitor, a diode, a light-emitting device, an organic light-emitting device, an active matrix quantum dot light-emitting diode, a quantum dot light-emitting diode, a display, a secondary cell, a piezoelectric element, and a solar battery.

4. The method according to claim 1, wherein, in the step of forming semiconductor device array patterns, the semiconductor device arrays are separated using a laser beam.

5. The method according to claim 1, wherein the step of forming a stretchable substrate further comprises a step of forming a supporting layer on the second carrier substrate.

6. The method according to claim 1, wherein the step of forming a stretchable substrate further comprises a step of forming an adhesive layer on the stretchable substrate.

7. The method according to claim 1, wherein the step of forming the plurality of semiconductor devices comprises a step of forming the flexible substrate on the first carrier substrate;
a step of forming a first gate electrode on the flexible substrate;
a step of forming a gate insulating film on the first gate electrode;
a step of forming an oxide semiconductor layer on the gate insulating film so that the oxide semiconductor layer corresponds to the first gate electrode;
a step of forming a source electrode and a drain electrode on both sides of the oxide semiconductor layer, respectively; and
a step of forming a passivation layer on the source and drain electrodes,
wherein the step of forming the flexible substrate further comprises a step of forming a supporting layer on the first carrier substrate; and a step of forming a buffer layer on the flexible substrate,
the step of forming a source electrode and a drain electrode further comprises a step of forming an etch stopper layer on the oxide semiconductor layer,
the step of forming a passivation layer further comprises a step of forming a second gate electrode on the passivation layer, and the first and second gate electrodes are electrically connected to each other to receive identical voltages.

8. The method according to claim 7, wherein the step of forming a passivation layer further comprises a step of forming a polyimide layer on the passivation layer.

9. The method according to claim 7, wherein the flexible substrate comprises at least one of polyester, polyvinyl, polycarbonate, polyethylene, polyacetate, polyimide, polyethersulphone (PES), polyacrylate (PAR), polyethylene naphthalate (PEN), and polyethylene terephthalate (PET).

10. The method according to claim 7, wherein the oxide semiconductor layer comprises at least one of indium gallium zinc oxide (IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc oxide (AZTO).

11. The method according to claim 7, wherein the source electrode or the drain electrode comprises at least one of molybdenum (Mo), aluminum (Al), chromium (Cr), gold (Au), titanium (Ti), nickel (Ni), neodymium (Nd), and copper (Cu).

12. The method according to claim 1, wherein the stretchable substrate comprises at least one of polydimethylsiloxane (PDMS), polyester, polyurethane (PU), polyurethane acrylate (PUA), polyphenylmethylsiloxane, hexamethyldisiloxane, polyvinyl alcohol (PVA), epoxy resins, and EcoFlex.

* * * * *